United States Patent
Hsieh et al.

(10) Patent No.: US 9,743,159 B2
(45) Date of Patent: Aug. 22, 2017

(54) BATTERY SENSOR WITH ADDRESSING MODE AND DETECTION MODE CAPABILITY

(71) Applicant: CYBER POWER SYSTEMS, INC., Taipei (TW)

(72) Inventors: Hung-Ming Hsieh, Taipei (TW); Hung-Chun Chien, Taipei (TW); Yung-Hao Peng, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 0 days.

(21) Appl. No.: 15/077,074

(22) Filed: Mar. 22, 2016

(65) Prior Publication Data

US 2016/0337722 A1 Nov. 17, 2016

(30) Foreign Application Priority Data

May 15, 2015 (TW) .............................. 104115682 A

(51) Int. Cl.
*H04Q 9/00* (2006.01)
*G01R 31/36* (2006.01)

(52) U.S. Cl.
CPC ............ *H04Q 9/00* (2013.01); *G01R 31/3648* (2013.01)

(58) Field of Classification Search
CPC ...... H04Q 9/00; H04Q 2209/30; G01R 31/40; G01R 31/3644; G01R 31/3658; G01R 31/3648; H01M 10/46; H01M 10/425
See application file for complete search history.

(56) References Cited

U.S. PATENT DOCUMENTS

| | | | | |
|---|---|---|---|---|
| 5,422,558 A | * | 6/1995 | Stewart ................. | H02J 7/0021 320/120 |
| 6,611,774 B1 | * | 8/2003 | Zaccaria ............ | G01R 31/3648 320/116 |
| 2004/0095249 A1 | * | 5/2004 | Zaccaria ............ | G01R 31/3648 340/636.1 |
| 2006/0259280 A1 | * | 11/2006 | Zaccaria ............ | G01R 31/3648 702/188 |
| 2008/0018486 A1 | * | 1/2008 | Terasawa ............ | G06F 13/4291 340/636.1 |
| 2008/0312853 A1 | * | 12/2008 | Rocci ..................... | G01R 31/40 702/63 |
| 2011/0068746 A1 | | 3/2011 | Rocci et al. | |
| 2011/0082955 A1 | * | 4/2011 | Wortham ............ | G06F 13/4256 710/110 |

(Continued)

*Primary Examiner* — Orlando Bousono
(74) *Attorney, Agent, or Firm* — Bacon & Thomas, PLLC

(57) ABSTRACT

A battery sensor with addressing mode and detection mode capability comprising a processor, an input interface, an output interface, an addressing channel and a detection channel; the processor connected to at least one battery parameter detection circuit; the addressing channel used a series connection manner to connect with a series connection input interface of the input interface, the processor and a series connection output interface of the output interface; a first communication interface of the input interface and a second communication interface of the output interface can be parallel connected to the processor by the detection channel; wherein the battery sensor can execute a battery addressing mode by the addressing channel, and the battery sensor can execute a battery parameter detection mode by the detection channel.

18 Claims, 19 Drawing Sheets

(56) References Cited

U.S. PATENT DOCUMENTS

| | | | | |
|---|---|---|---|---|
| 2011/0288798 | A1* | 11/2011 | Rocci | G01R 31/40 |
| | | | | 702/63 |
| 2013/0002016 | A1* | 1/2013 | Furukawa | H01M 10/425 |
| | | | | 307/9.1 |
| 2013/0058377 | A1* | 3/2013 | Rocci | G01R 31/40 |
| | | | | 374/152 |
| 2013/0265009 | A1* | 10/2013 | Janz | H04L 12/417 |
| | | | | 320/134 |
| 2015/0064513 | A1* | 3/2015 | Thoelmann | H01M 10/4207 |
| | | | | 429/50 |
| 2015/0156089 | A1* | 6/2015 | Mc Cleland | H04L 43/08 |
| | | | | 307/1 |
| 2015/0270727 | A1* | 9/2015 | Fukute | G01R 31/3658 |
| | | | | 320/107 |
| 2015/0341179 | A1* | 11/2015 | Butler | H04L 12/10 |
| | | | | 370/419 |

\* cited by examiner

BATTERY SENSOR WITH ADDRESSING MODE AND DETECTION MODE CAPABILITY

BACKGROUND OF THE INVENTION

1. Field of the Invention

The invention relates to a battery sensor with addressing mode and detection mode capability, and more particularly to a battery sensor having an addressing channel and a detection channel; the battery sensor can execute series connection communication in the addressing mode, and the battery sensor can execute parallel connection communication in the detection mode.

2. Description of Related Art

A first prior-art is disclosed in US Patent Application Publication No. US20110068746, the first prior-art entitled "Method and apparatus for intelligent battery charge equalization and monitoring", the apparatus has a sensor (300), the sensor (300) may include a diode (307), the anode of diode (307) may be connected both to a microcontroller (310) and a battery (301), the cathode of the diode (307) may be connected both to the microcontroller (310) and a first (308) and a second (309) communications interface ports, the diode (307) in this arrangement may provide a summing function, such that when the sensor (300) is placed in a string with other like sensors, the sensor (300) may determine its position within the string. But the first prior-art used V-string Pins (String Voltage Pins) of the diode (307) and the microcontroller (310) to determine its position within the string, in order to differentiate V-string value of each sensor (300) in the string, the number of strung sensors (300) of the string will be limited, the first prior-art can not continuously string a large number of sensors (300). If the above apparatus needs to string a large number of sensors (300), the apparatus costs will be higher. Thus, there is a requirement of improvement for the first prior-art.

A second prior-art used a hardware manner to execute a battery addressing, the second prior-art configured one or at least one DIP switch (dual in-line package switch) on each sensor, therefore can define communication address of each sensor. But a required number of DIP switches will be increased, when the second prior-art is used to a monitoring system having many sensors, the apparatus costs will be higher, and user must set communication address of each sensor one by one. Thus, there is a requirement of improvement for the second prior-art.

A third prior-art used a software manner to execute a battery addressing, the third prior-art usually used a particular user interface to set communication address of each sensor. But the operation steps of the third prior-art are more complicated, and user needs more setting time to set communication address of each sensor one by one. Thus, there is a requirement of improvement for the third prior-art.

SUMMARY OF THE INVENTION

It is therefore an object of the invention to provide a battery sensor with addressing mode and detection mode capability comprising a processor, an input interface, an output interface, an addressing channel and a detection channel; the processor connected to at least one battery parameter detection circuit; the addressing channel used a series connection manner to connect with a series connection input interface of the input interface, the processor and a series connection output interface of the output interface; a first communication interface of the input interface and a second communication interface of the output interface can be parallel connected to the processor by the detection channel; wherein the battery sensor can execute a battery addressing mode by the addressing channel, and the battery sensor can execute a battery parameter detection mode by the detection channel.

First advantages of the invention is, the channel framework of the invention will not limit the connection number of the battery sensors, user can connect a large number of battery sensors. Thus, the invention can reduce the apparatus costs.

Second advantages of the invention is, the battery sensor of the invention can execute series connection communication in the battery addressing mode, and the battery sensor of the invention can execute parallel connection communication in the battery parameter detection mode. The invention dose not need to configure a large number DIP switches, therefore can simplify the setting operation of the battery addressing, and reduce the required time of the battery addressing. Thus, the invention can improve the defects of the hardware manner of battery addressing and the software manner of battery addressing.

Third advantages of the invention is, the battery sensor of the invention further has a switch, a processor of the battery sensor can reduce the occupied pins of the processor by the switch.

The above and other objects, features and advantages of the invention will become apparent from the following detailed description taken with the accompanying drawings.

DETAILED DESCRIPTION OF THE INVENTION

Figure 1:
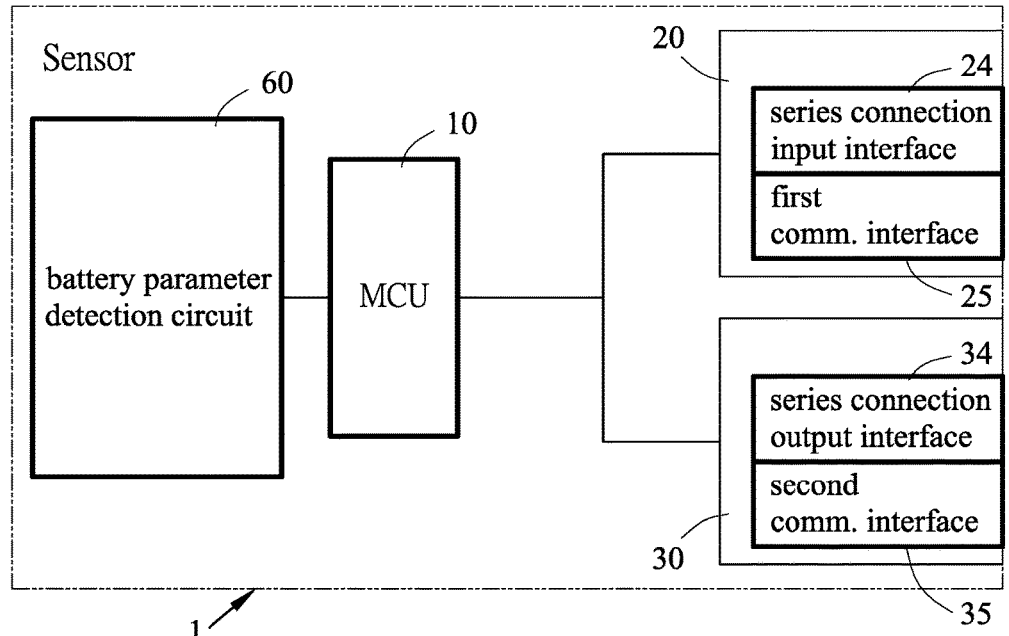
FIG. 1 is a functional block diagram illustrating the first embodiment of the invention.
Figure 2:
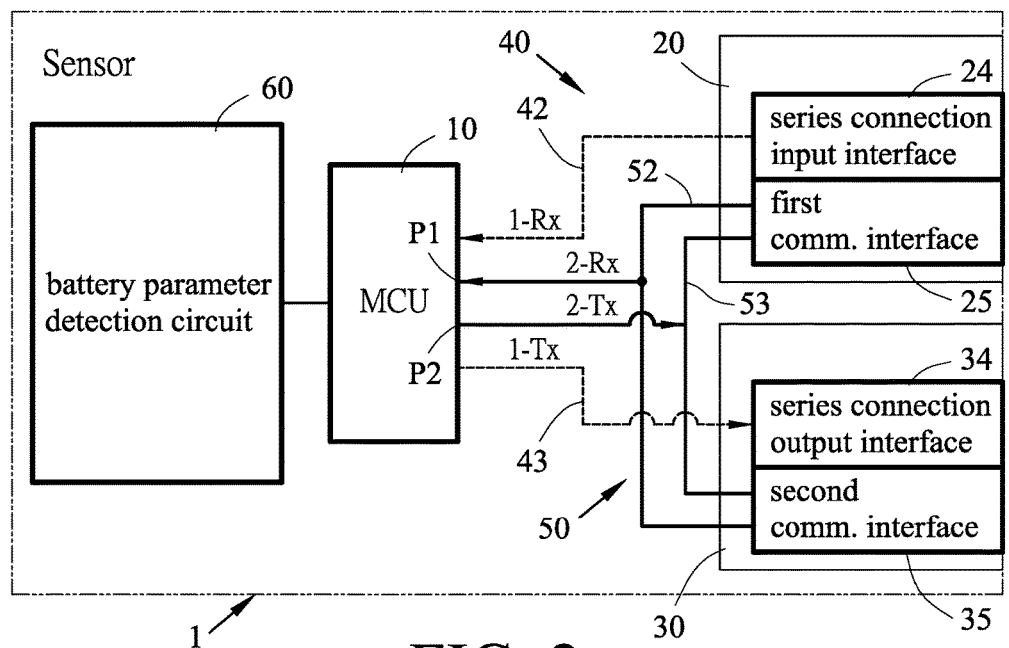
FIGS. 2 to 9 are the functional block diagram variation illustrating the first embodiment of the invention.

Referring to FIGS. 1 to 2, a battery sensor 1 in accordance with a first embodiment of the invention comprises a processor 10, an input interface 20, an output interface 30, an addressing channel 40 and a detection channel 50; the processor 10 connected to at least one battery parameter detection circuit 60, the input interface 20 has a series connection input interface 24 and a first communication interface 25, the output interface 30 has a series connection output interface 34 and a second communication interface 35; the addressing channel 40 used a series connection manner to connect with the series connection input interface 24, the processor 10 and the series connection output interface 34; the first communication interface 25 and the second communication interface 35 can be parallel connected to the processor 10 by the detection channel 50; wherein the battery sensor 1 can execute a battery addressing mode by the addressing channel 40, and the battery sensor 1 can execute a battery parameter detection mode by the detection channel 50.

Referring to FIG. 2, examples of a first executing manner of the addressing channel 40 and the detection channel 50, the addressing channel 40 has a first receiving data (1-Rx) input line 42 and a first transmitting data (1-Tx) output line 43; the 1-Rx input line 42 is used to connect the series connection input interface 24 and the processor 10; the 1-Tx output line 43 is used to connect the processor 10 and the series connection output interface 34; the detection channel 50 has a second receiving data (2-Rx) input line 52 and a second transmitting data (2-Tx) output line 53; the first communication interface 25 and the second communication interface 35 can be parallel connected to a pin P1 of the processor 10 by the 2-Rx input line 52; the first communication interface 25 and the second communication interface 35 can be parallel connected to another pin P2 of the processor 10 by the 2-Tx output line 53. Examples of communication path, when the battery sensor 1 is operated in the battery addressing mode, a sequence of communication input path is, the series connection input interface 24, the 1-Rx input line 42 and the processor 10; a sequence of communication output path is, the processor 10, the 1-Tx output line 43 and the series connection output interface 34; when the battery sensor 1 is operated in the battery parameter detection mode, a sequence of communication input path is, the first communication interface 25 together with the second communication interface 35, the 2-Rx input line 52 and the processor 10; a sequence of communication output path is, the processor 10, the 2-Tx output line 53, the first communication interface 25 together with the second communication interface 35.

Figure 3:
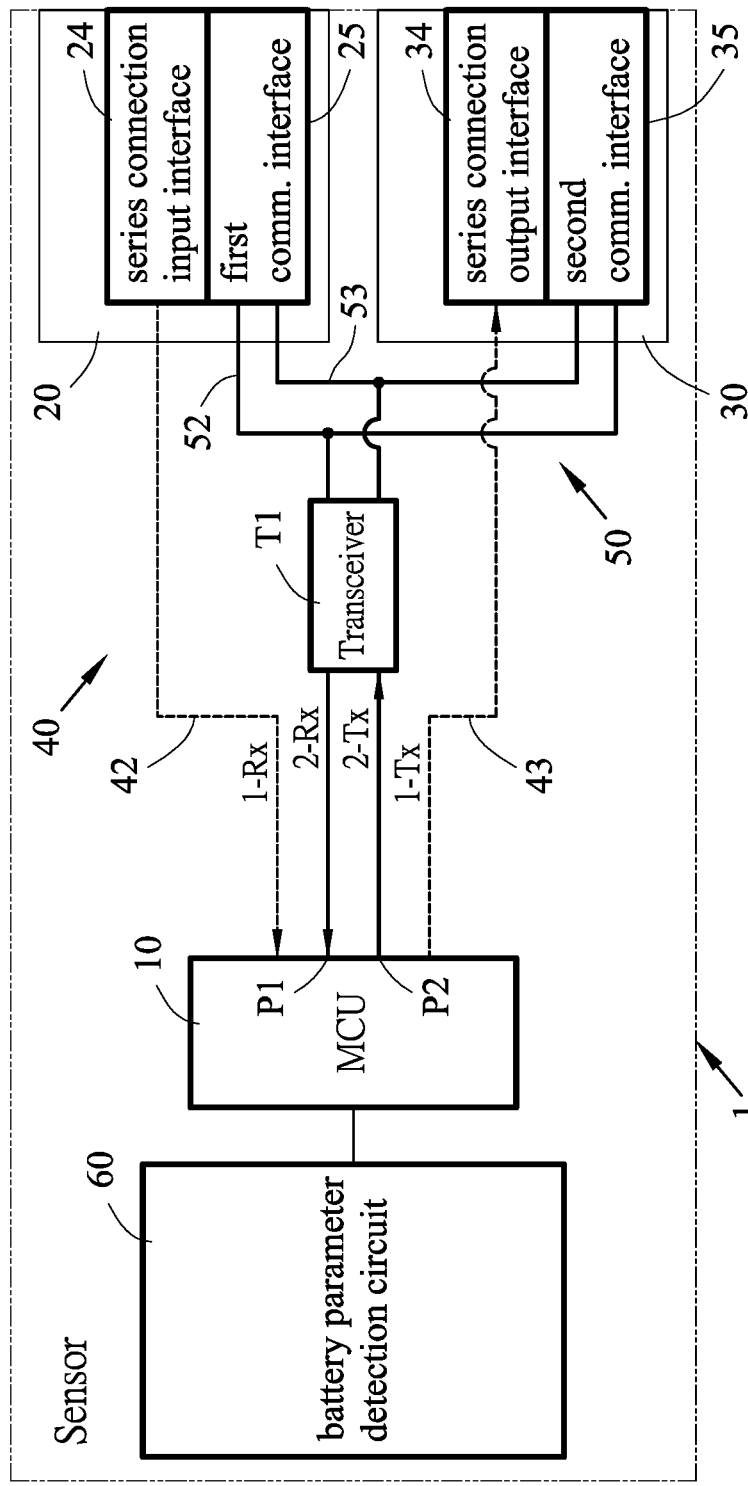

Referring to FIG. 3, the battery sensor 1 in accordance with a first embodiment of the invention further has a first transceiver T1, the first transceiver T1 is connected to the 2-Rx input line 52 and the 2-Tx output line 53; the first transceiver T1 can transform a data into an electrical signal, the first transceiver T1 can also transform an electrical signal into a data; the communication of the battery sensor 1 can obtain a better reliability and an isolated protection effect by the first transceiver T1.

Figure 4:
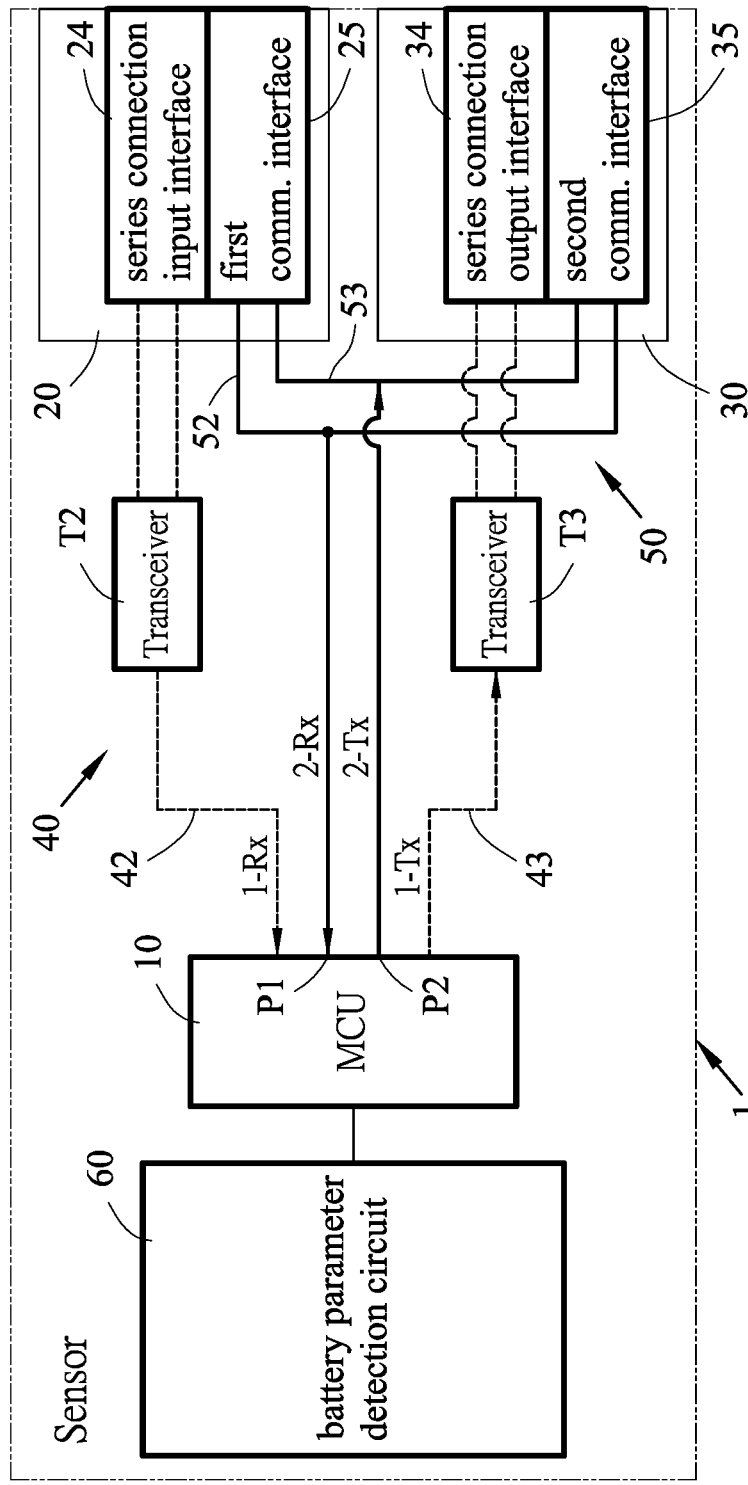

Referring to FIG. 4, the battery sensor 1 in accordance with a first embodiment of the invention further has a second transceiver T2 and a third transceiver T3; the second transceiver T2 is connected to the 1-Rx input line 42, the third transceiver T3 is connected to the 1-Tx output line 43; the second transceiver T2 and the third transceiver T3 can transform a data into an electrical signal, the second transceiver T2 and the third transceiver T3 can also transform an electrical signal into a data; the communication of the battery sensor 1 can obtain a better reliability and an isolated protection effect by the second transceiver T2 and the third transceiver T3.

Figure 5:
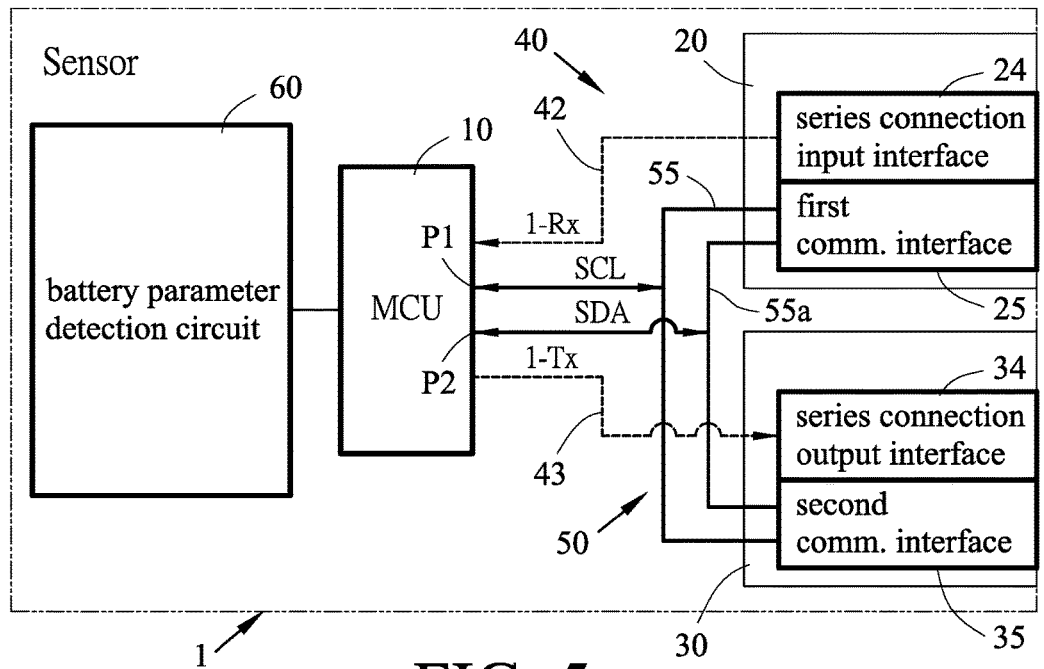

Referring to FIG. 5, examples of a second executing manner of the addressing channel 40 and the detection channel 50, the addressing channel 40 has a first receiving data (1-Rx) input line 42 and a first transmitting data (1-Tx) output line 43; the 1-Rx input line 42 is used to connect the series connection input interface 24 and the processor 10; the 1-Tx output line 43 is used to connect the processor 10 and the series connection output interface 34; the detection channel 50 has a serial clock (SCL) line 55 and a serial data (SDA) line 55a; the first communication interface 25 and the second communication interface 35 can be parallel connected to a pin P1 of the processor 10 by the SCL line 55; the first communication interface 25 and the second communication interface 35 can be parallel connected to another pin P2 of the processor 10 by the SDA line 55a. Examples of communication path, when the battery sensor 1 is operated in the battery addressing mode, a sequence of communication input path is, the series connection input interface 24, the 1-Rx input line 42 and the processor 10; a sequence of communication output path is, the processor 10, the 1-Tx output line 43 and the series connection output interface 34; when the battery sensor 1 is operated in the battery parameter detection mode, the two-way communication path of serial clock (SCL) is, the first communication interface 25 together with the second communication interface 35, the SCL line 55 and the processor 10; the two-way communication path of serial data (SDA) is, the processor 10, the SDA line 55a, the first communication interface 25 together with the second communication interface 35.

Figure 6:
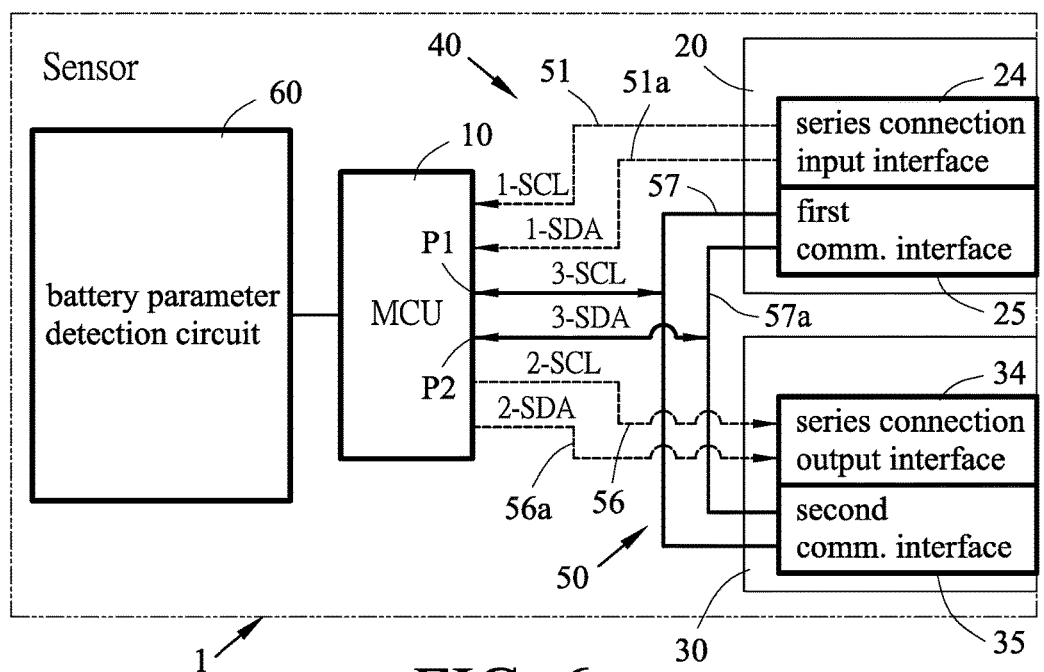

Referring to FIG. 6, examples of a third executing manner of the addressing channel 40 and the detection channel 50, the addressing channel 40 has a first serial clock (1-SCL) line 51, a first serial data (1-SDA) line 51a, a second serial clock (2-SCL) line 56 and a second serial data (2-SDA) line 56a; the 1-SCL line 51 and the 1-SDA line 51a are used to connect the series connection input interface 24 and the processor 10; the 2-SCL line 56 and the 2-SDA line 56a are used to connect the processor 10 and the series connection output interface 34; the detection channel 50 has a third serial clock (3-SCL) line 57 and a third serial data (3-SDA) line 57a; the first communication interface 25 and the second communication interface 35 can be parallel connected to a pin P1 of the processor 10 by the 3-SCL line 57; the first communication interface 25 and the second communication interface 35 can be parallel connected to another pin P2 of the processor 10 by the 3-SDA line 57a. Examples of communication path, when the battery sensor 1 is operated in the battery addressing mode, a sequence of serial clock (SCL) communication input path is, the series connection input interface 24, the 1-SCL line 51 and the processor 10; a sequence of serial data (SDA) communication input path is, the series connection input interface 24, the 1-SDA line 51a and the processor 10; a sequence of serial clock (SCL) communication output path is, the processor 10, the 2-SCL line 56 and the series connection output interface 34; a sequence of serial data (SDA) communication output path is, the processor 10, the 2-SDA line 56a and the series connection output interface 34; when the battery sensor 1 is operated in the battery parameter detection mode, the two-way communication path of serial clock (SCL) is, the first communication interface 25 together with the second communication interface 35, the 3-SCL line 57 and the processor 10; the two-way communication path of serial data (SDA) is, the processor 10, the 3-SDA line 57a, the first communication interface 25 together with the second communication interface 35.

Figure 7:
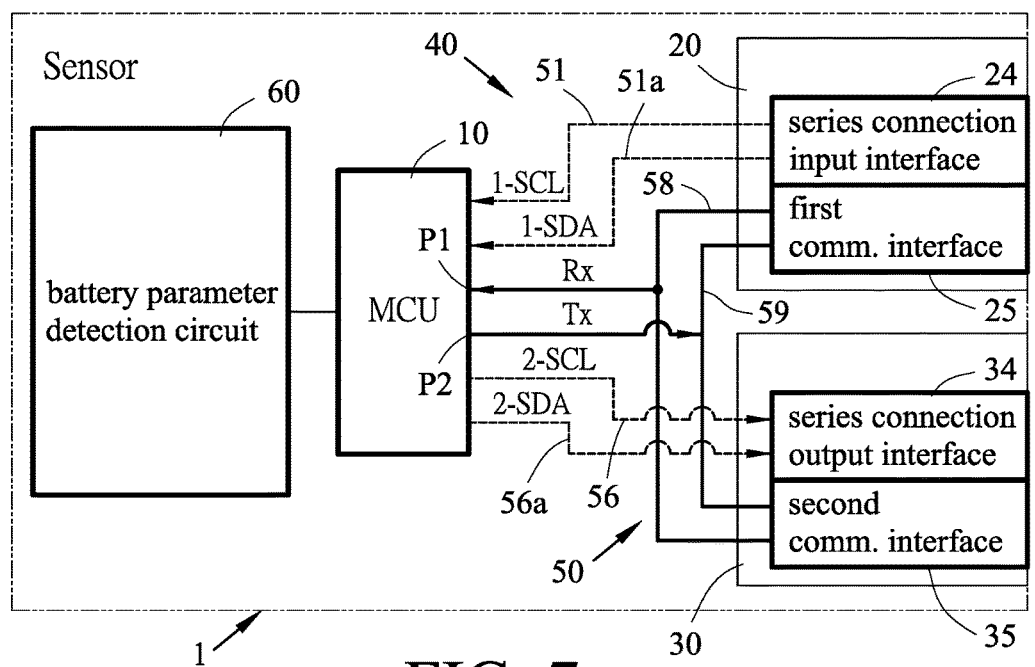

Referring to FIG. 7, examples of a fourth executing manner of the addressing channel 40 and the detection channel 50, the addressing channel 40 has a first serial clock (1-SCL) line 51, a first serial data (1-SDA) line 51a, a second serial clock (2-SCL) line 56 and a second serial data (2-SDA) line 56a; the 1-SCL line 51 and the 1-SDA line 51a are used to connect the series connection input interface 24 and the processor 10; the 2-SCL line 56 and the 2-SDA line 56a are used to connect the processor 10 and the series connection output interface 34; the detection channel 50 has a receiving data (Rx) input line 58 and a transmitting data (Tx) output line 59; the first communication interface 25 and the second communication interface 35 can be parallel connected to a pin P1 of the processor 10 by the Rx input line 58; the first communication interface 25 and the second communication interface 35 can be parallel connected to another pin P2 of the processor 10 by the Tx output line 59. Examples of a communication path, when the battery sensor 1 is operated in the battery addressing mode, a sequence of serial clock (SCL) communication input path is, the series connection input interface 24, the 1-SCL line 51 and the processor 10; a sequence of serial data (SDA) communication input path is, the series connection input interface 24, the 1-SDA line 51a and the processor 10; a sequence of serial clock (SCL) communication output path is, the processor 10, the 2-SCL line 56 and the series connection output interface 34; a sequence of serial data (SDA) communication output path is, the processor 10, the 2-SDA line 56a and the series connection output interface 34; when the battery sensor 1 is operated in the battery parameter detection mode, a sequence of communication input path is, the first communication interface 25 together with the second communication interface 35, the Rx input line 58 and the processor 10; a sequence of communication output path is, the processor 10, the Tx output line 59, the first communication interface 25 together with the second communication interface 35.

Figure 8:
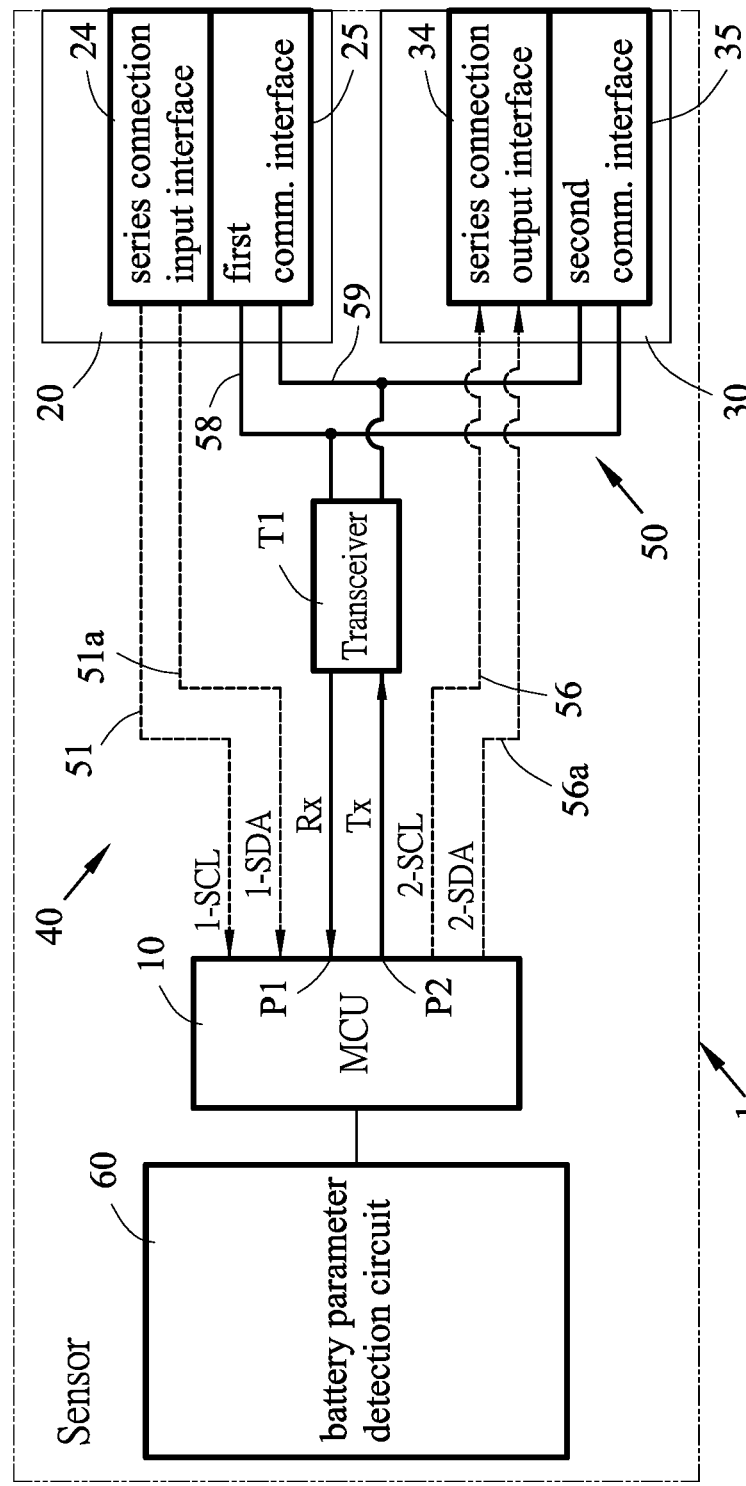

Referring to FIG. 8, examples of a fifth executing manner of the addressing channel 40 and the detection channel 50, the fifth executing manner is almost same to the fourth executing manner, the difference between the fifth executing manner and the fourth executing manner is, the battery sensor 1 further has a first transceiver T1; wherein the first transceiver T1 is connected to the Rx input line 58 and the Tx output line 59.

Figure 9:
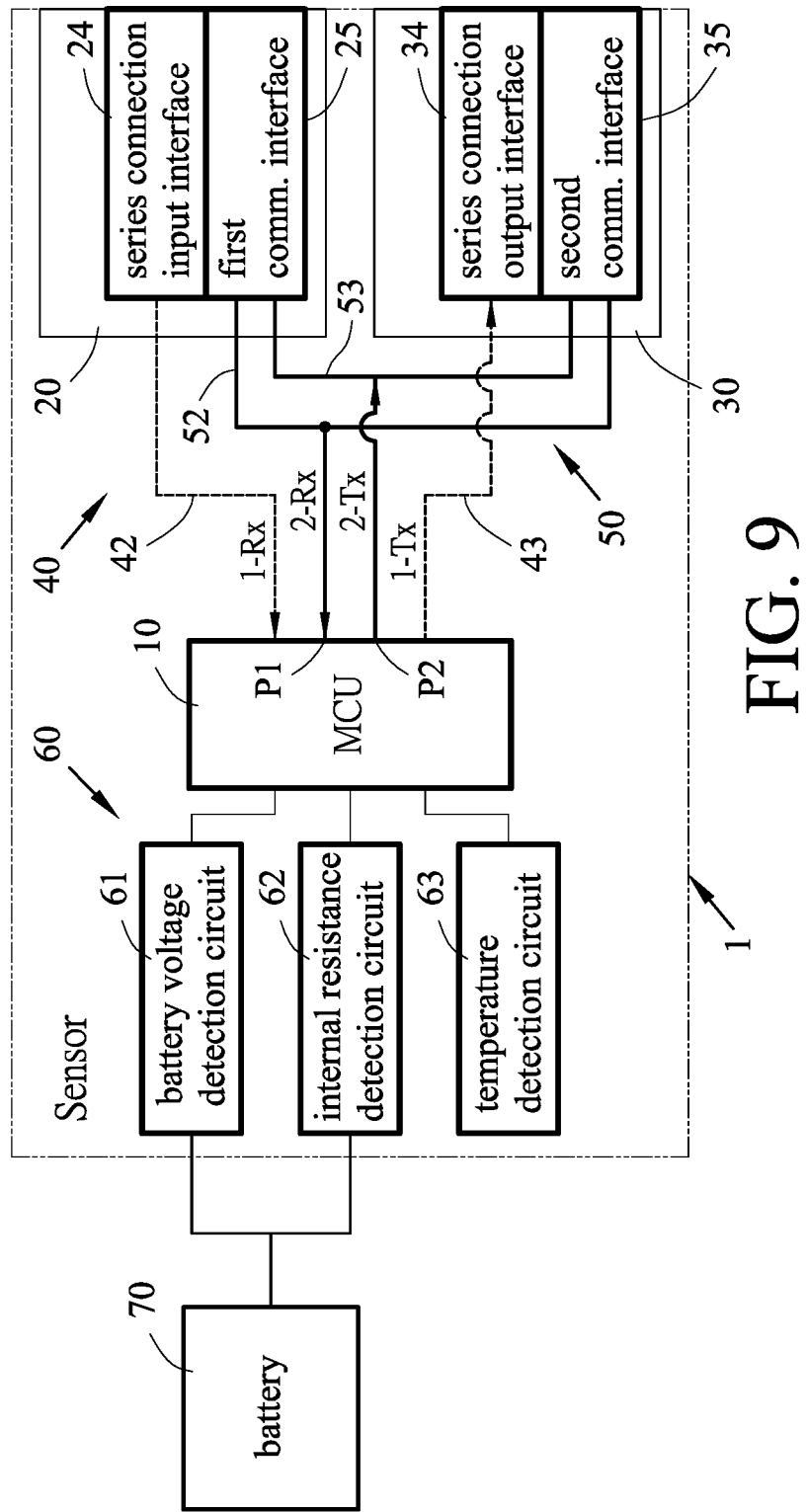

Referring to FIG. 9, examples of an executing manner of the battery parameter detection circuit 60, the battery sensor 1 can connect a battery 70, the battery parameter detection circuit 60 is connected to the processor 10; wherein the processor 10 can detect parameters of the battery 70 by the battery parameter detection circuit 60, the battery parameter detection circuit 60 can select from a battery voltage detection circuit 61, a battery internal resistance detection circuit 62 and a battery temperature detection circuit 63.

Figure 10:
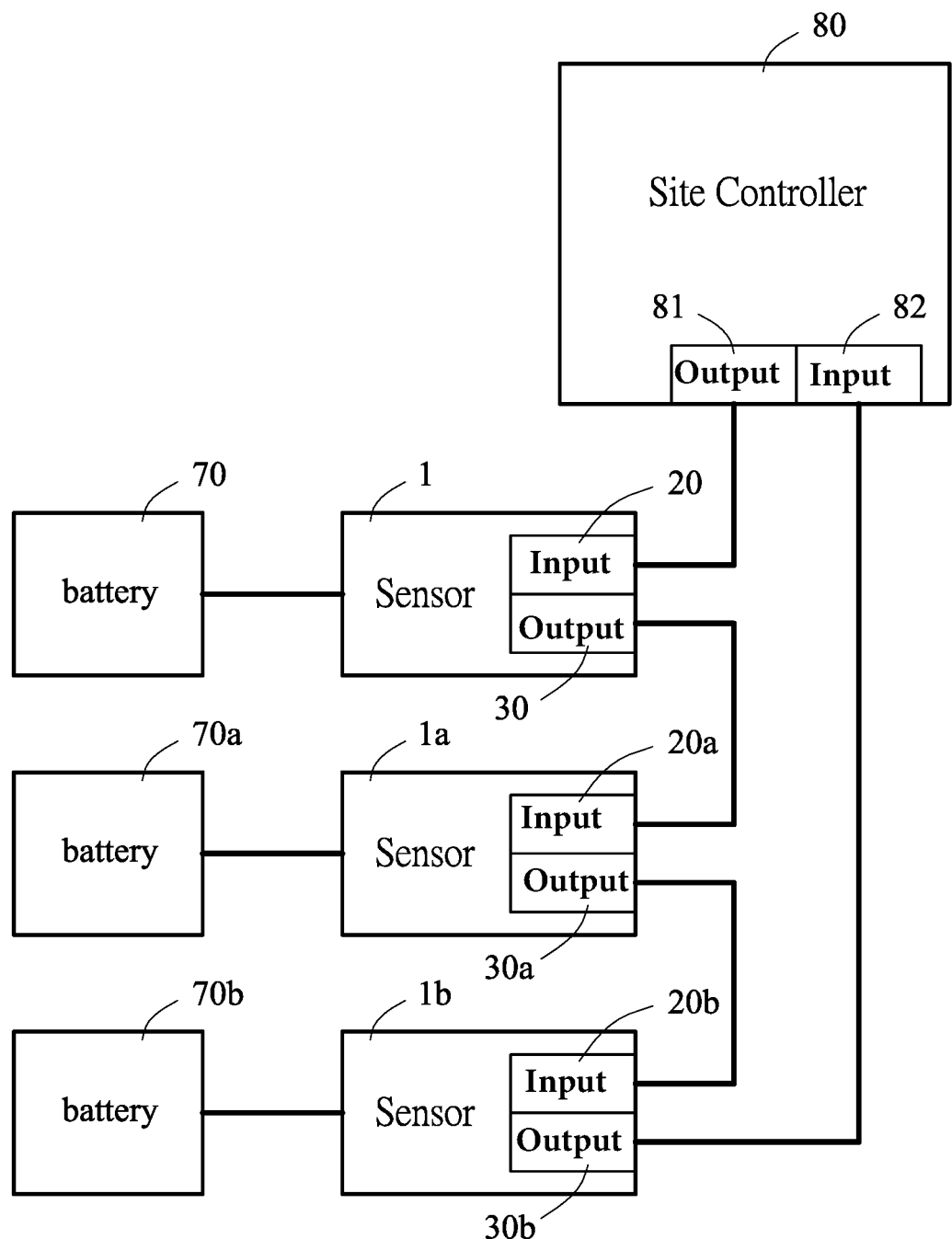
FIG. 10 is a using status diagram illustrating the first embodiment of the invention.

Referring to FIG. 10, examples of a using manner of the battery sensor 1, the battery sensor 1 can connect a site controller 80, the battery sensor 1 connected at least one a second battery sensor 1a and a third battery sensor 1b, the battery sensor 1 can connect a battery 70, the second battery sensor 1a can connect a second battery 70a, the third battery sensor 1b can connect a third battery 70b; wherein an output interface 81 of the site controller 80 is connected to the input interface 20 of the battery sensor 1, the output interface 30 of the battery sensor 1 is connected to an input interface 20a of the second battery sensor 1a, an output interface 30a of the second battery sensor 1a is connected to an input interface 20b of the third battery sensor 1b, an output interface 30b of the third battery sensor 1b is connected to an input interface 82 of the site controller 80.

Examples of an executing manner of the site controller 80, when the site controller 80 detected that any battery sensor has not been addressed or any address is in conflict, the site controller 80 can be switched to an auto addressing mode; in the period of the auto addressing mode, the site controller 80 will transmit an addressing command; if the battery sensor 1 is first battery sensor which received the addressing command, then the battery sensor 1 will be addressed to Address#1 by its addressing mode; if the second battery sensor 1a is second battery sensor which received the addressing command, then the second battery sensor 1a will be addressed to Address#2; if the third battery sensor 1b is third battery sensor which received the addressing command, then the third battery sensor 1b will be addressed to Address#3.

Figure 11:
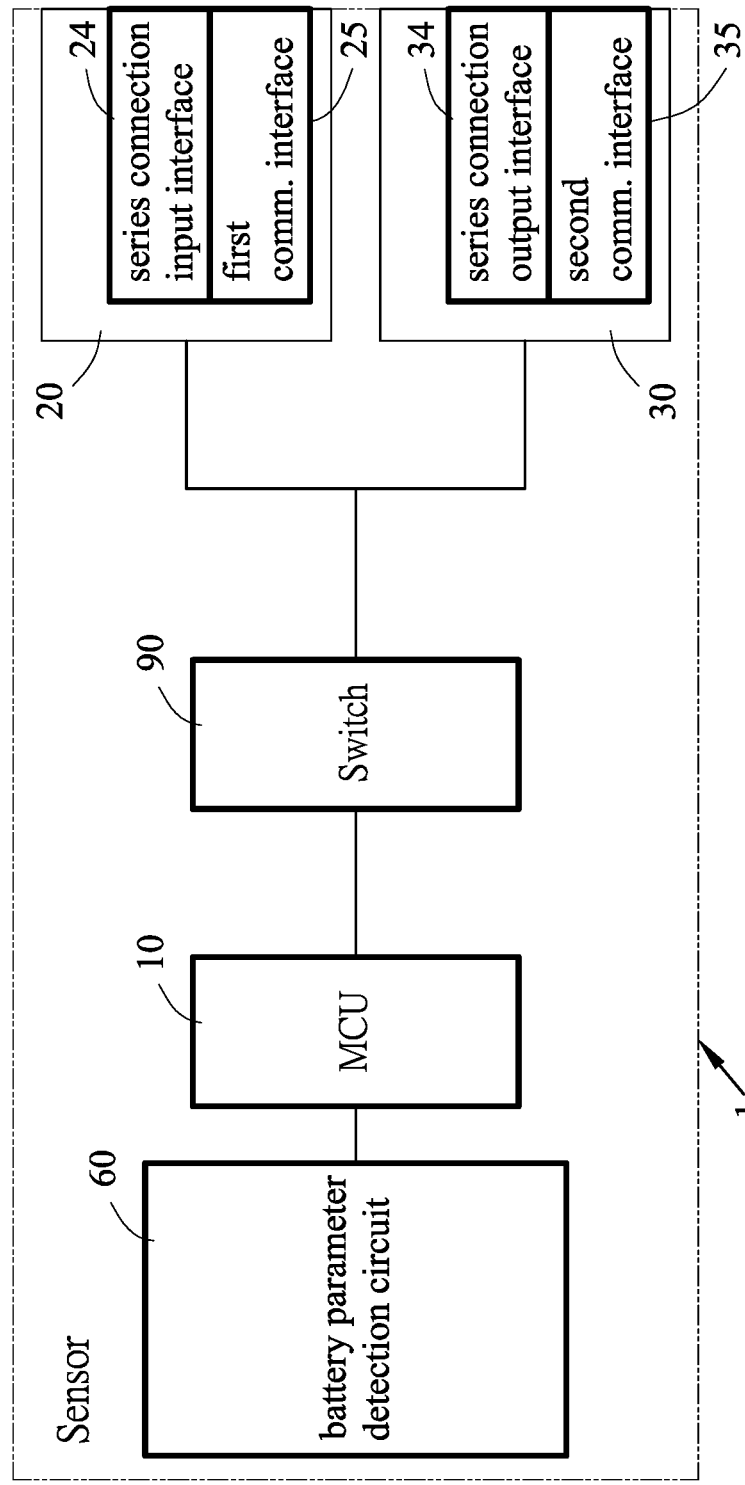
FIG. 11 is a functional block diagram illustrating the second embodiment of the invention.
Figure 12:
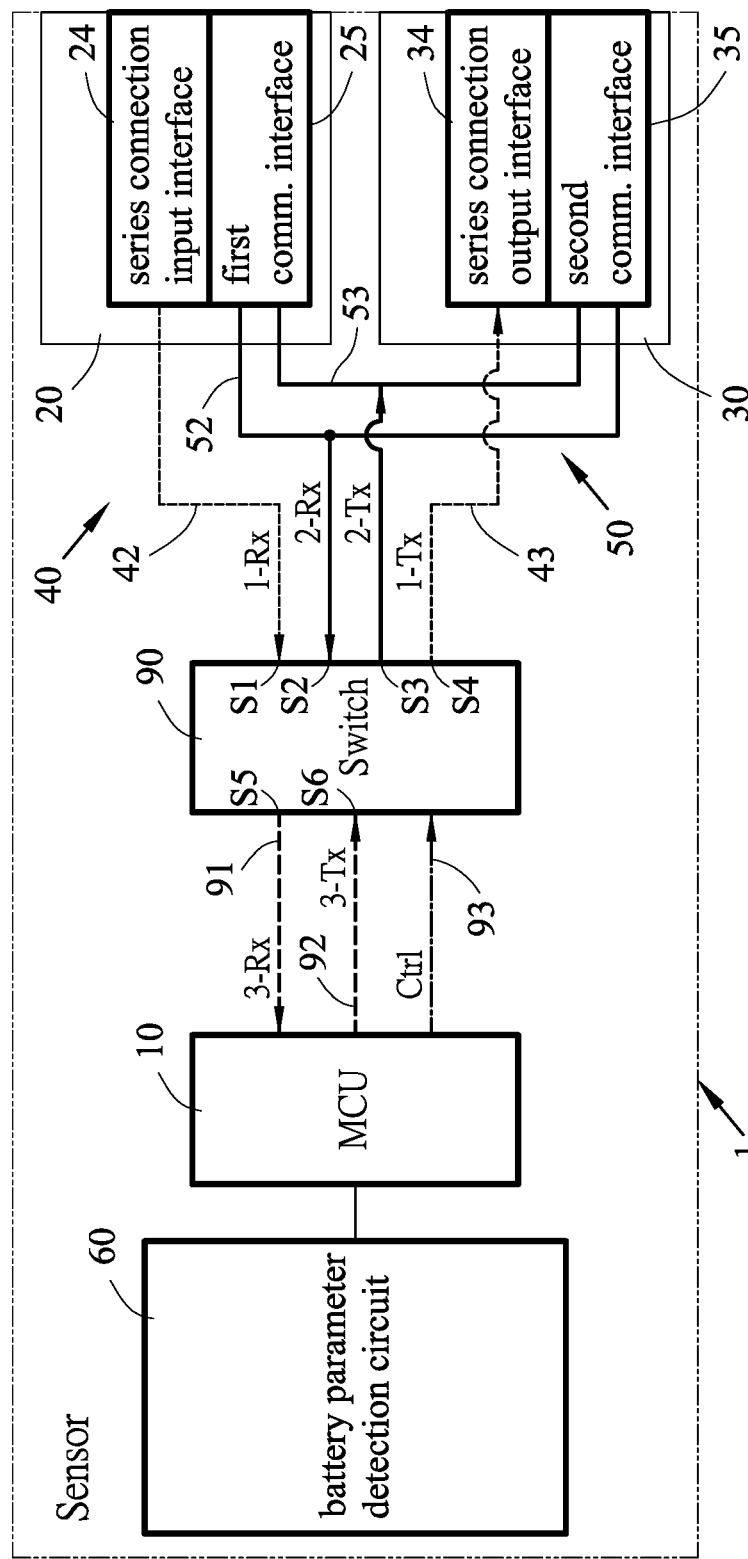
FIGS. 12 to 15 are the functional block diagram variation illustrating the second embodiment of the invention.

Referring to FIGS. 11 to 12, a battery sensor 1 in accordance with a second embodiment of the invention comprises a processor 10, a switch 90, an input interface 20, an output interface 30, an addressing channel 40 and a detection channel 50; the processor 10 connected to at least one battery parameter detection circuit 60, the switch 90 is connected to the processor 10; the input interface 20 has a series connection input interface 24 and a first communication interface 25; the output interface 30 has a series connection output interface 34 and a second communication interface 35; the addressing channel 40 used a series connection manner to connect with the series connection input interface 24, the switch 90 and the series connection output interface 34; the first communication interface 25 and the second communication interface 35 can be parallel connected to the switch 90 by the detection channel 50; wherein the battery sensor 1 can execute a battery addressing mode by the addressing channel 40, and the battery sensor 1 can execute a battery parameter detection mode by the detection channel 50, the processor 10 can switch between the battery addressing mode and the battery parameter detection mode by the switch 90.

Referring to FIG. 12, examples of a sixth executing manner of the addressing channel 40 and the detection channel 50, the addressing channel 40 has a first receiving data (1-Rx) input line 42 and a first transmitting data (1-Tx) output line 43; the series connection input interface 24 is connected to a pin S1 of the switch 90 by the 1-Rx input line 42; the series connection output interface 34 is connected to a pin S4 of the switch 90 by the 1-Tx output line 43; the detection channel 50 has a second receiving data (2-Rx) input line 52 and a second transmitting data (2-Tx) output line 53; the first communication interface 25 and the second communication interface 35 can be parallel connected to a pin S2 of the switch 90 by the 2-Rx input line 52; the first communication interface 25 and the second communication interface 35 can be parallel connected to a pin S3 of the switch 90 by the 2-Tx output line 53; a third receiving data (3-Rx) input line 91, a third transmitting data (3-Tx) output line 92 and a control (Ctrl) line 93 are provided between the switch 90 and the processor 10; the processor 10 is connected to a pin S5 of the switch 90 by the 3-Rx input line 91, the processor 10 is connected to a pin S6 of the switch 90 by the 3-Tx output line 92, and the processor 10 can control the switch 90 by the Ctrl line 93, therefore can switch between the battery addressing mode and the battery parameter detection mode.

Examples of communication path of FIG. 12, when the battery sensor 1 is operated in the battery addressing mode, a sequence of communication input path is, the series connection input interface 24, the 1-Rx input line 42, the switch 90 (at this time, the pin S1 and the pin S5 formed a passageway), the 3-Rx input line 91 and the processor 10; a sequence of communication output path is, the processor 10, the 3-Tx output line 92, the switch 90 (at this time, the pin S6 and the pin S4 formed a passageway), the 1-Tx output line 43 and the series connection output interface 34; when the battery sensor 1 is operated in the battery parameter detection mode, a sequence of communication input path is, the first communication interface 25 together with the second communication interface 35, the 2-Rx input line 52, the switch 90 (at this time, the pin S2 and the pin S5 formed a passageway), the 3-Rx input line 91 and the processor 10; a sequence of communication output path is, the processor 10, the 3-Tx output line 92, the switch 90 (at this time, the pin S6 and the pin S3 formed a passageway), the 2-Tx output line 53, the first communication interface 25 together with the second communication interface 35. Thus, the switch 90 can reduce the occupied pins of the processor 10.

Figure 13:
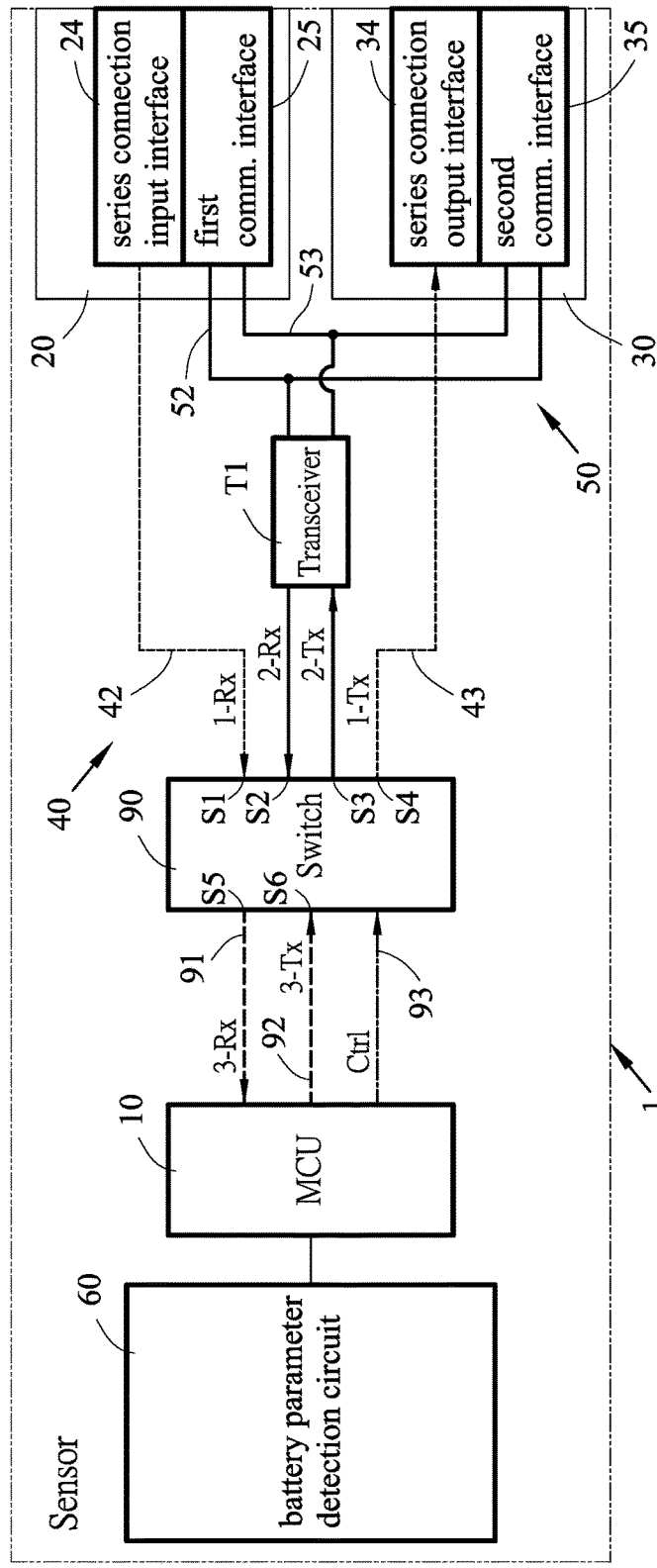
Figure 14:
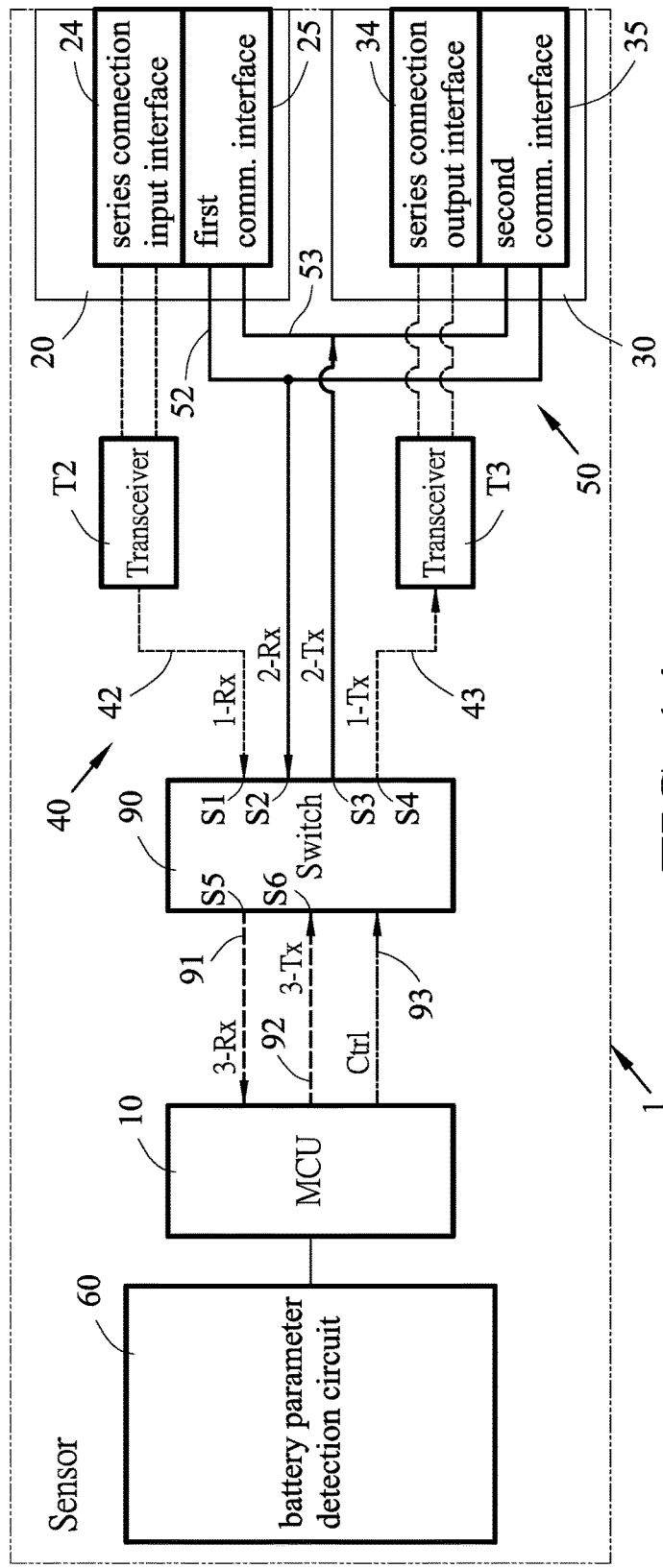

Referring to FIGS. 13 to 14, examples of a seventh executing manner of the addressing channel 40 and the detection channel 50, the seventh executing manner is almost same to the sixth executing manner, the difference between the seventh executing manner and the sixth executing manner is, the battery sensor 1 has a first transceiver T1 (as shown in FIG. 13), the first transceiver T1 is connected to the 2-Rx input line 52 and the 2-Tx output line 53. Another way is, the battery sensor 1 has a second transceiver T2 and a third transceiver T3 (as shown in FIG. 14), the second transceiver T2 is connected to the 1-Rx input line 42, the third transceiver T3 is connected to the 1-Tx output line 43.

Figure 15:
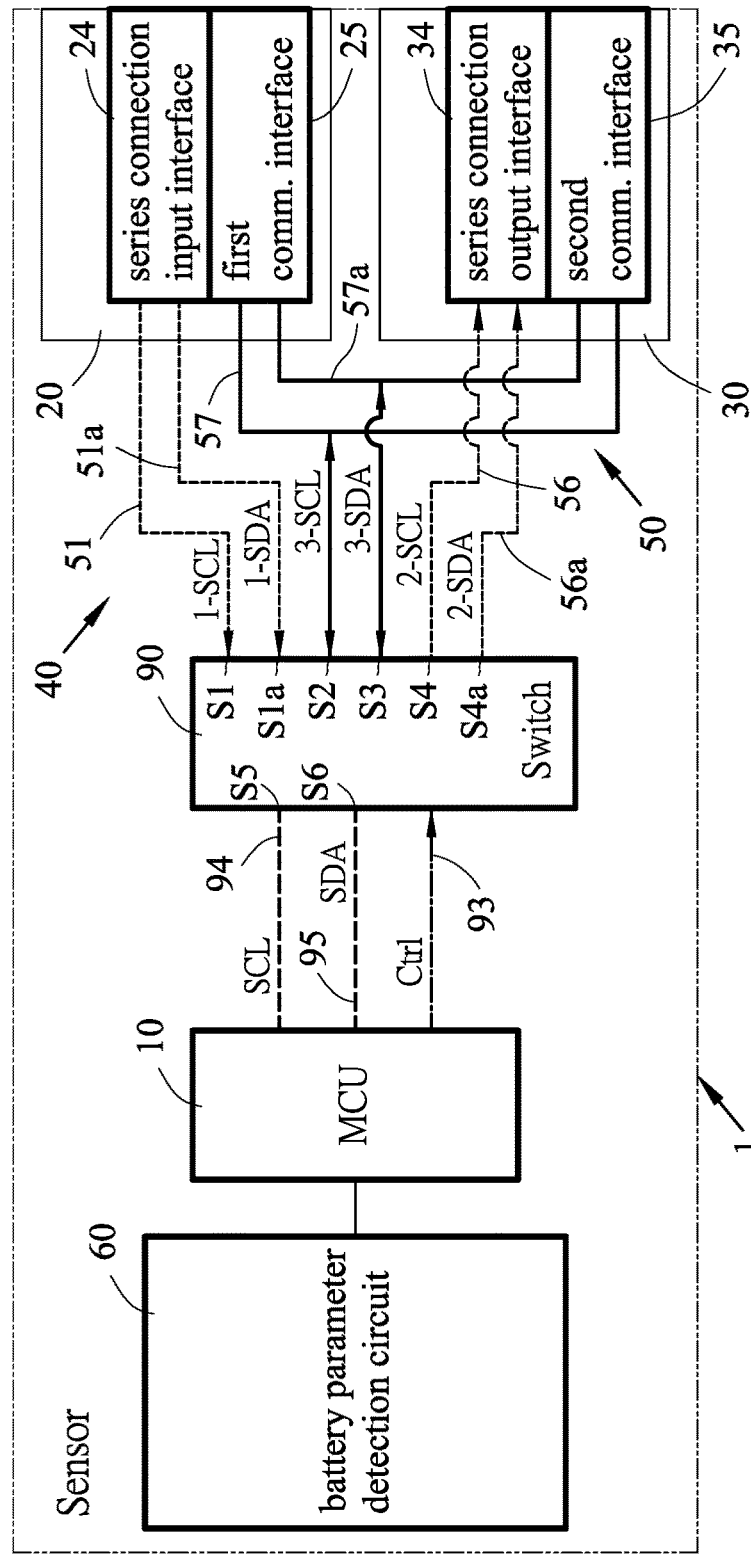

Referring to FIG. 15, examples of a eighth executing manner of the addressing channel 40 and the detection channel 50, the addressing channel 40 has a first serial clock (1-SCL) line 51, a first serial data (1-SDA) line 51a, a second serial clock (2-SCL) line 56 and a second serial data (2-SDA) line 56a; the series connection input interface 24 is connected to a pin S1 of the switch 90 by the 1-SCL line 51, and the series connection input interface 24 is connected to a pin S1a of the switch 90 by the 1-SDA line 51a; the series connection output interface 34 is connected to a pin S4 of the switch 90 by the 2-SCL line 56, and the series connection output interface 34 is connected to a pin S4a of the switch 90 by the 2-SDA line 56a; the detection channel 50 has a third serial clock (3-SCL) line 57 and a third serial data (3-SDA) line 57a; the first communication interface 25 and the second communication interface 35 can be parallel connected to a pin S2 of the switch 90 by the 3-SCL line 57; the first communication interface 25 and the second communication interface 35 can be parallel connected to a pin S3 of the switch 90 by the 3-SDA line 57a; a serial clock (SCL) line 94, a serial data (SDA) line 95 and a control (Ctrl) line 93 are provided between the switch 90 and the processor 10; the processor 10 is connected to a pin S5 of the switch 90 by the SCL line 94, the processor 10 is connected to a pin S6 of the switch 90 by the SDA line 95, and the processor 10 can control the switch 90 by the Ctrl line 93, therefore can switch between the battery addressing mode and the battery parameter detection mode.

Examples of communication path of FIG. 15, when the battery sensor 1 is operated in the battery addressing mode, a sequence of serial clock (SCL) communication input path is, the series connection input interface 24, the 1-SCL line 51, the switch 90 (at this time, the pin S1 and the pin S5 formed a passageway), the SCL line 94 and the processor 10; a sequence of serial data (SDA) communication input path is, the series connection input interface 24, the 1-SDA line 51a, the switch 90 (at this time, the pin S1a and the pin S6 formed a passageway), the SDA line 95 and the processor 10; a sequence of SCL communication output path is, the processor 10, the SCL line 94, the switch 90 (at this time, the pin S5 and the pin S4 formed a passageway), the 2-SCL line 56 and the series connection output interface 34; a sequence of SDA communication output path is, the processor 10, the SDA line 95, the switch 90 (at this time, the pin S6 and the pin S4a formed a passageway), the 2-SDA line 56a and the series connection output interface 34; when the battery sensor 1 is operated in the battery parameter detection mode, the two-way communication path of SCL is, the first communication interface 25 together with the second communication interface 35, the 3-SCL line 57, the switch 90 (at this time, the pin S2 and the pin S5 formed a passageway), the SCL line 94 and the processor 10; the two-way communication path of SDA is, the first communication interface 25 together with the second communication interface 35, the 3-SDA line 57a, the switch 90 (at this time, the pin S3 and the pin S6 formed a passageway), the SDA line 95 and the processor 10.

Figure 16:
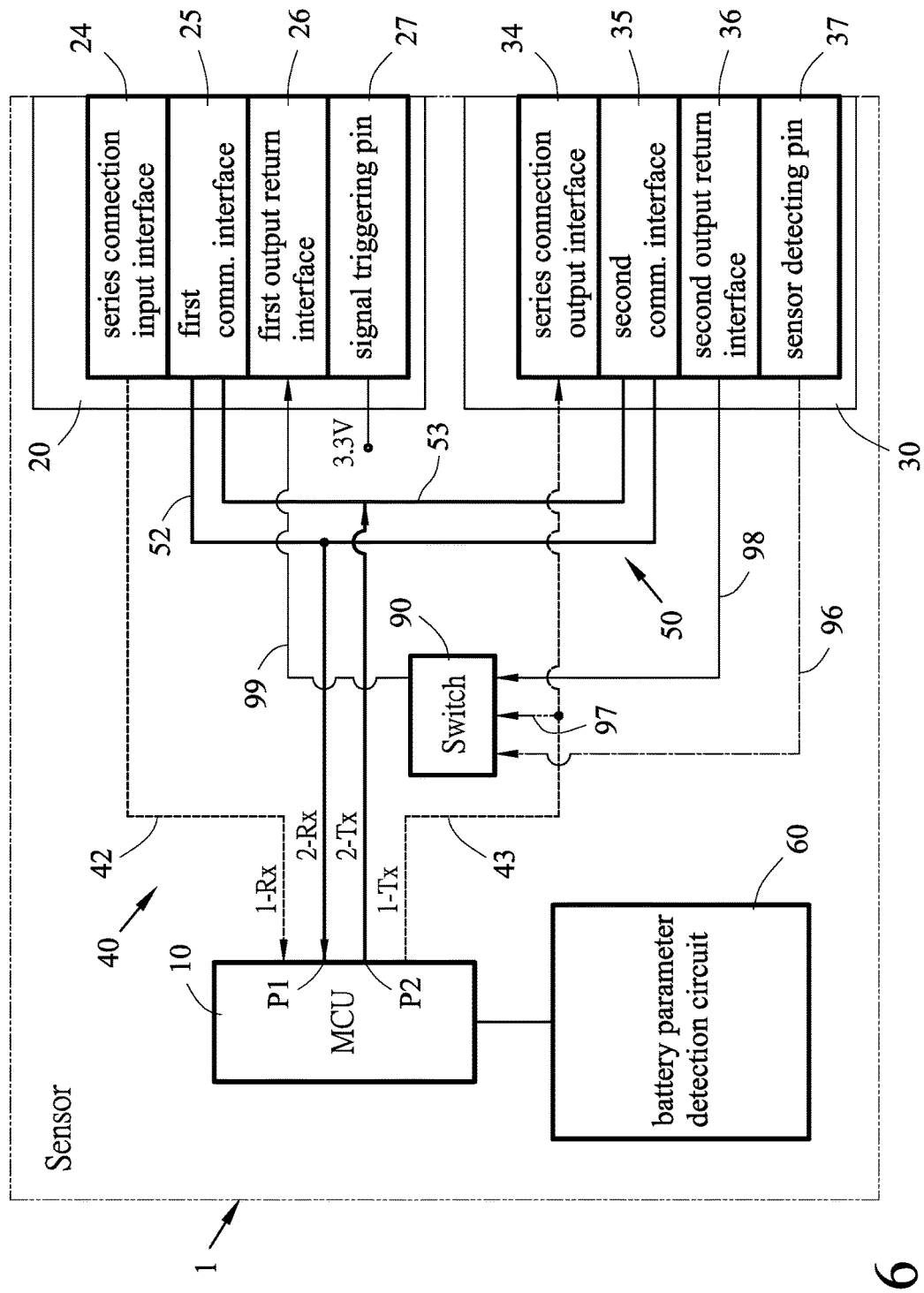
FIG. 16 is a functional block diagram illustrating the third embodiment of the invention.

Referring to FIG. 16, a battery sensor 1 in accordance with a third embodiment of the invention comprises a processor 10, an input interface 20, an output interface 30, an addressing channel 40 and a detection channel 50 and a switch 90; the processor 10 connected to at least one battery parameter detection circuit 60, the input interface 20 has a series connection input interface 24, a first communication interface 25, a first output return interface of series connection 26 and a signal triggering pin 27; the output interface 30 has a series connection output interface 34, a second communication interface 35, a second output return interface of series connection 36 and a sensor detecting pin 37; the addressing channel 40 has a first receiving data (1-Rx) input line 42 and a first transmitting data (1-Tx) output line 43; the 1-Rx input line 42 is used to connect the series connection input interface 24 and the processor 10; the 1-Tx output line 43 is used to connect the processor 10 and the series connection output interface 34; the detection channel 50 has a second receiving data (2-Rx) input line 52 and a second transmitting data (2-Tx) output line 53; the first communication interface 25 and the second communication interface 35 can be parallel connected to a pin P1 of the processor 10 by the 2-Rx input line 52; the first communication interface 25 and the second communication interface 35 can be parallel connected to another pin P2 of the processor 10 by the 2-Tx output line 53; the switch 90 has a first switching line 96, a second switching line 97, a third switching line 98 and a fourth switching line 99; the first switching line 96 is connected to the sensor detecting pin 37, the second switching line 97 is connected to the 1-Tx output line 43, the third switching line 98 is connected to the second output return interface of series connection 36, the fourth switching line 99 is connected to the first output return interface of series connection 26; wherein the battery sensor 1 can execute a battery addressing mode by the addressing channel 40, and the battery sensor 1 can execute a battery parameter detection mode by the detection channel 50.

Figure 17:
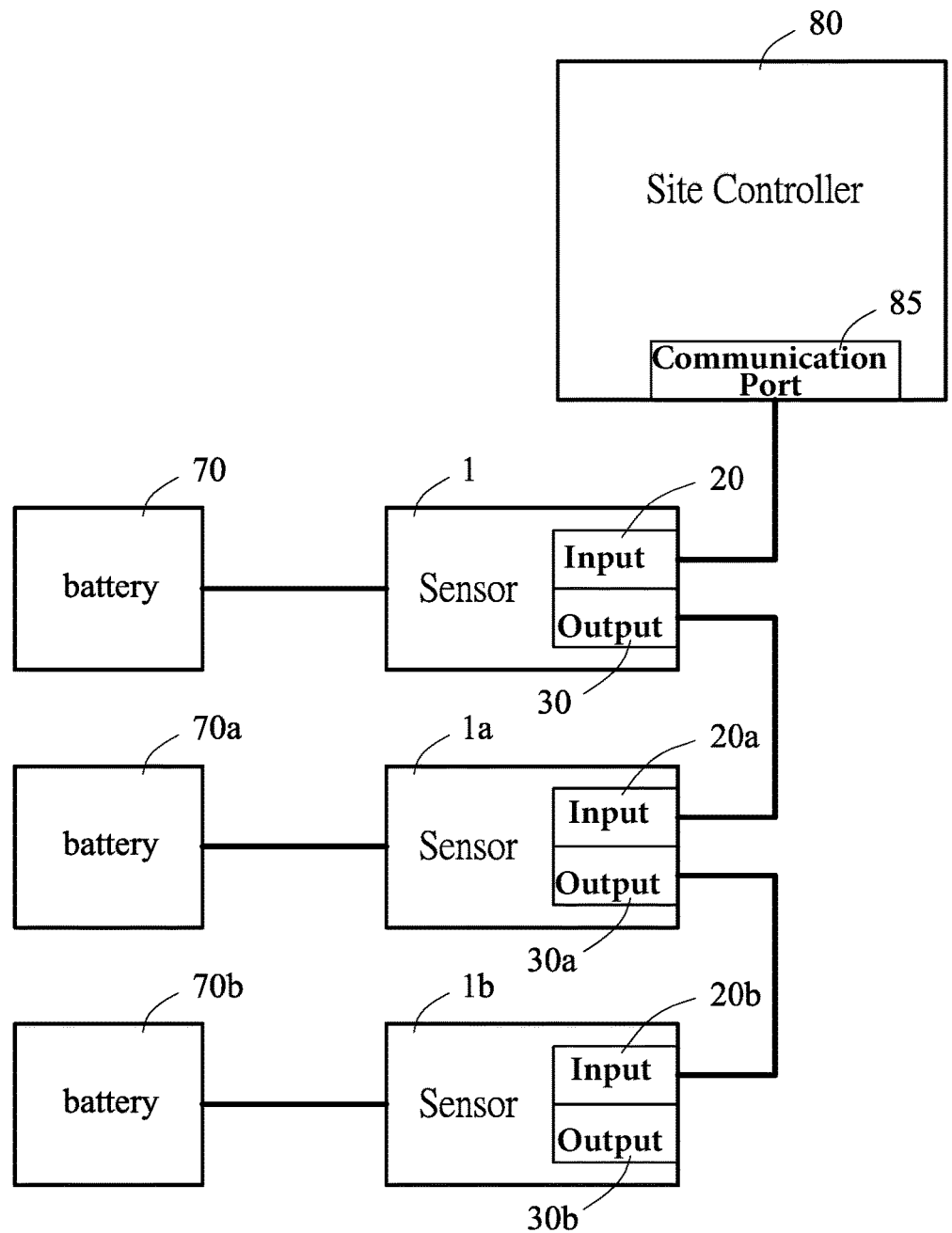
FIG. 17 is a using status diagram illustrating the third embodiment of the invention.

Referring to FIG. 17, examples of an executing manner of the battery sensor 1 in accordance with the third embodiment, the battery sensor 1 can connect a site controller 80, and the battery sensor 1 used a series connection manner to connect with at least one a second battery sensor 1a and a third battery sensor 1b; the battery sensor 1 can connect a battery 70, the second battery sensor 1a can connect a second battery 70a, the third battery sensor 1b can connect a third battery 70b; wherein an communication port 85 of the site controller 80 is connected to the input interface 20 of the battery sensor 1, the output interface 30 of the battery sensor 1 is connected to an input interface 20a of the second battery sensor 1a, an output interface 30a of the second battery sensor 1a is connected to an input interface 20b of the third battery sensor 1b.

Figure 18:
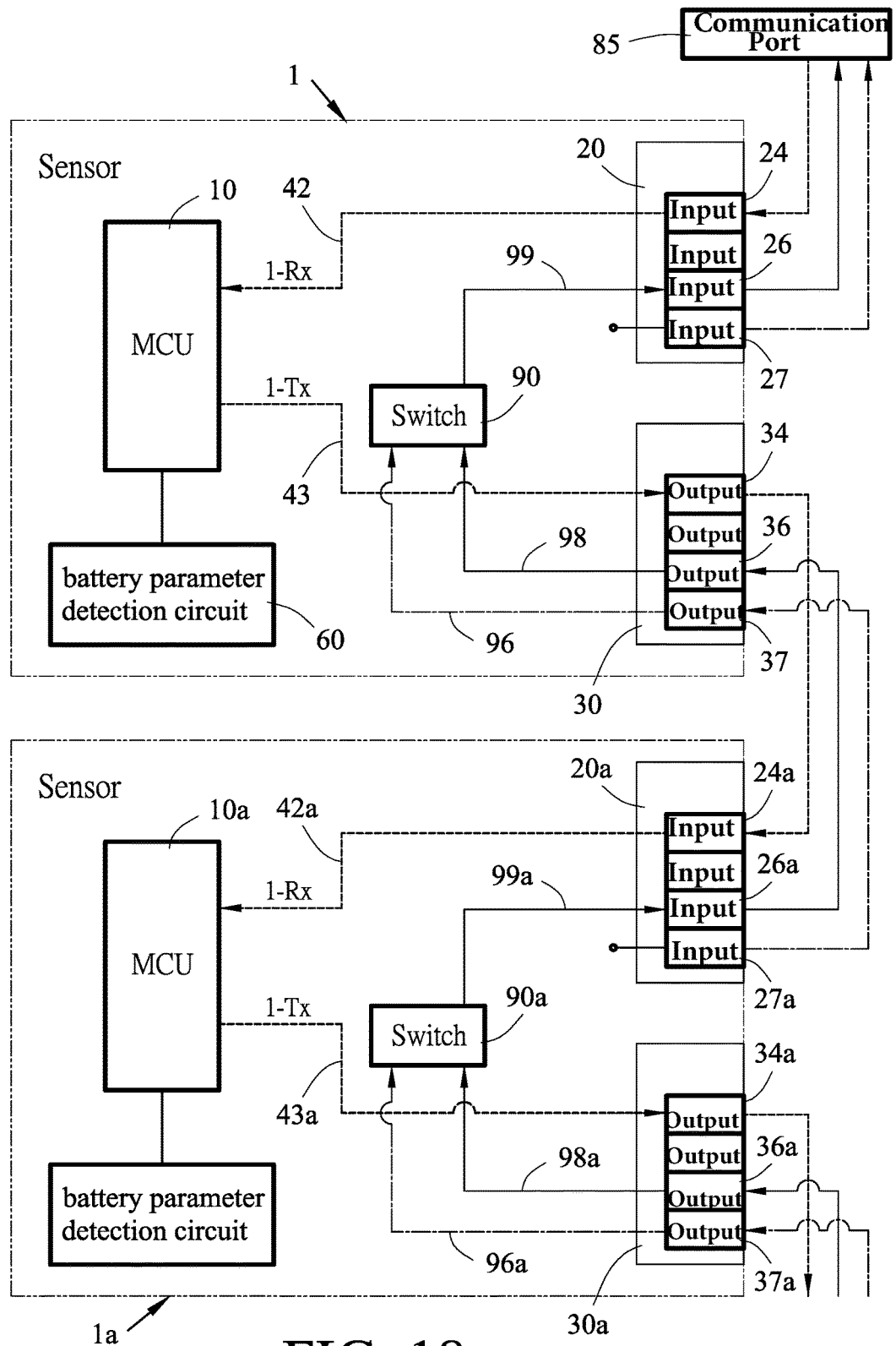
FIGS. 18 to 19 are the path diagram of series connection communication illustrating the third embodiment of the invention.
Figure 19:
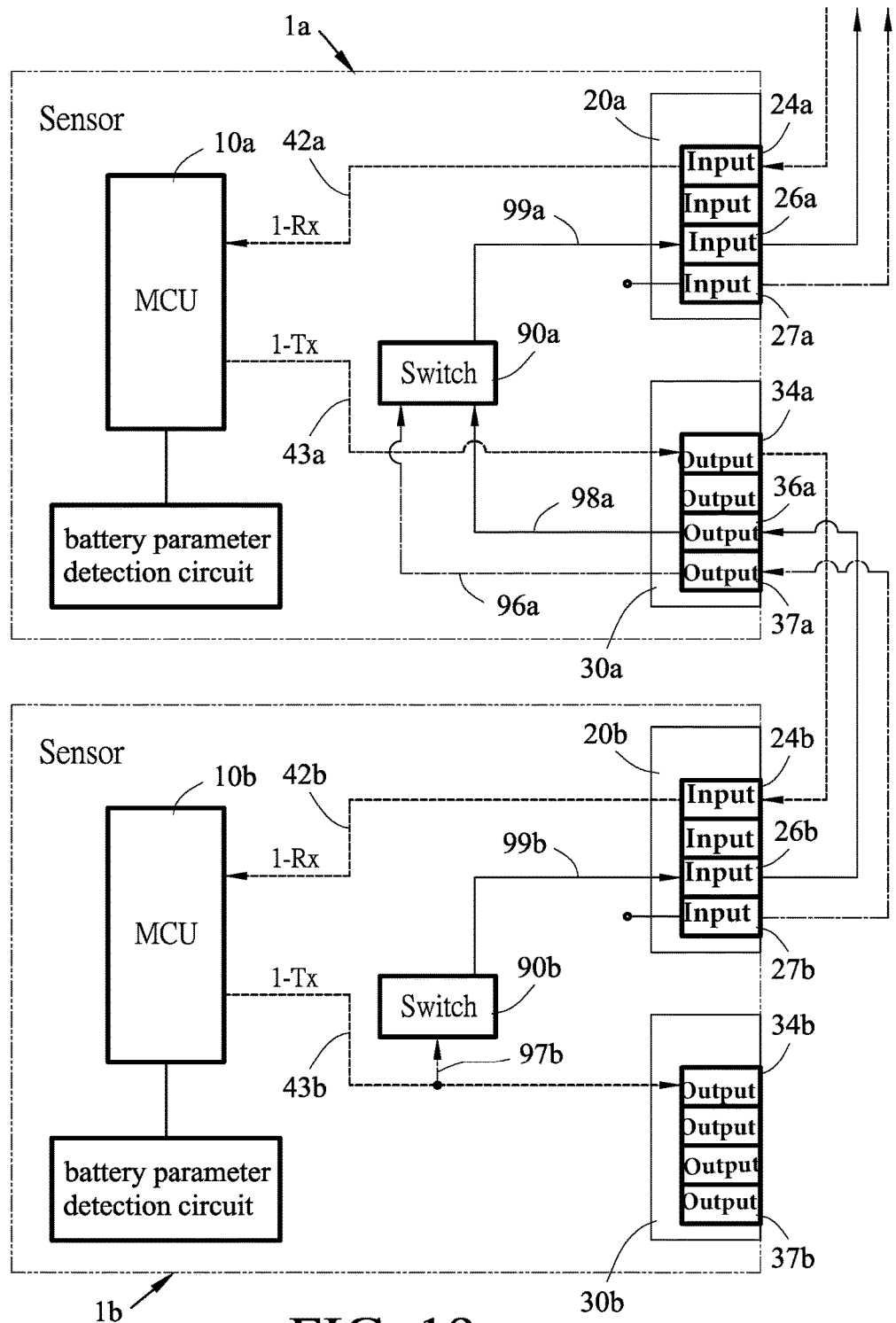

Referring to FIGS. 18 to 19, examples of a series connection communication path in accordance with the third embodiment, when the battery sensor 1 is operated in the battery addressing mode, a sequence of input path of series connection signal is, the communication port 85, the series connection input interface 24 of the battery sensor 1, the 1-Rx input line 42, the processor 10, the 1-Tx output line 43, the series connection output interface 34 of the battery sensor 1, a series connection input interface 24a of the second battery sensor 1a, a 1-Rx input line 42a, a processor 10a, a 1-Tx output line 43a, a series connection output interface 34a of the second battery sensor 1a, a series connection input interface 24b of the third battery sensor 1b, a 1-Rx input line 42b, a processor 10b, a 1-Tx output line 43b, a series connection output interface 34b of the third battery sensor 1b. A signal triggering pin 27a of the second battery sensor 1a can transmit a first detecting signal, the sensor detecting pin 37 of the battery sensor 1 can receive the first detecting signal to control the switch 90 of the battery sensor 1, therefore the third switching line 98 and the fourth switching line 99 of the battery sensor 1 can form a passageway. A signal triggering pin 27b of the third battery sensor 1b can transmit a second detecting signal, a sensor detecting pin 37a of the second battery sensor 1a can receive the second detecting signal to control a switch 90a of the second battery sensor 1a, therefore a third switching line 98a and a fourth switching line 99a of the second battery sensor 1a can form a passageway. If the third battery sensor 1b is last battery sensor, a sensor detecting pin 37b of the third battery sensor 1b will not receive any detecting signal, a switch 90b of the third battery sensor 1b will enable a second switching line 97b and a fourth switching line 99b of the third battery sensor 1b to form a passageway. A sequence of output return path of series connection signal is, the processor 10b of the third battery sensor 1b, the 1-Tx output line 43b, the second switching line 97b, the switch 90b, the fourth switching line 99b, a first output return interface of series connection 26b of the third battery sensor 1b, a second output return interface of series connection 36a of the second battery sensor 1a, the third switching line 98a, the switch 90a, the fourth switching line 99a, a first output return interface of series connection 26a of the second battery sensor 1a, the second output return interface of series connection 36 of the battery sensor 1, the third switching line 98, the switch 90, the fourth switching line 99, the first output return interface of series connection 26 of the battery sensor 1 and the communication port 85.

Figure 20:
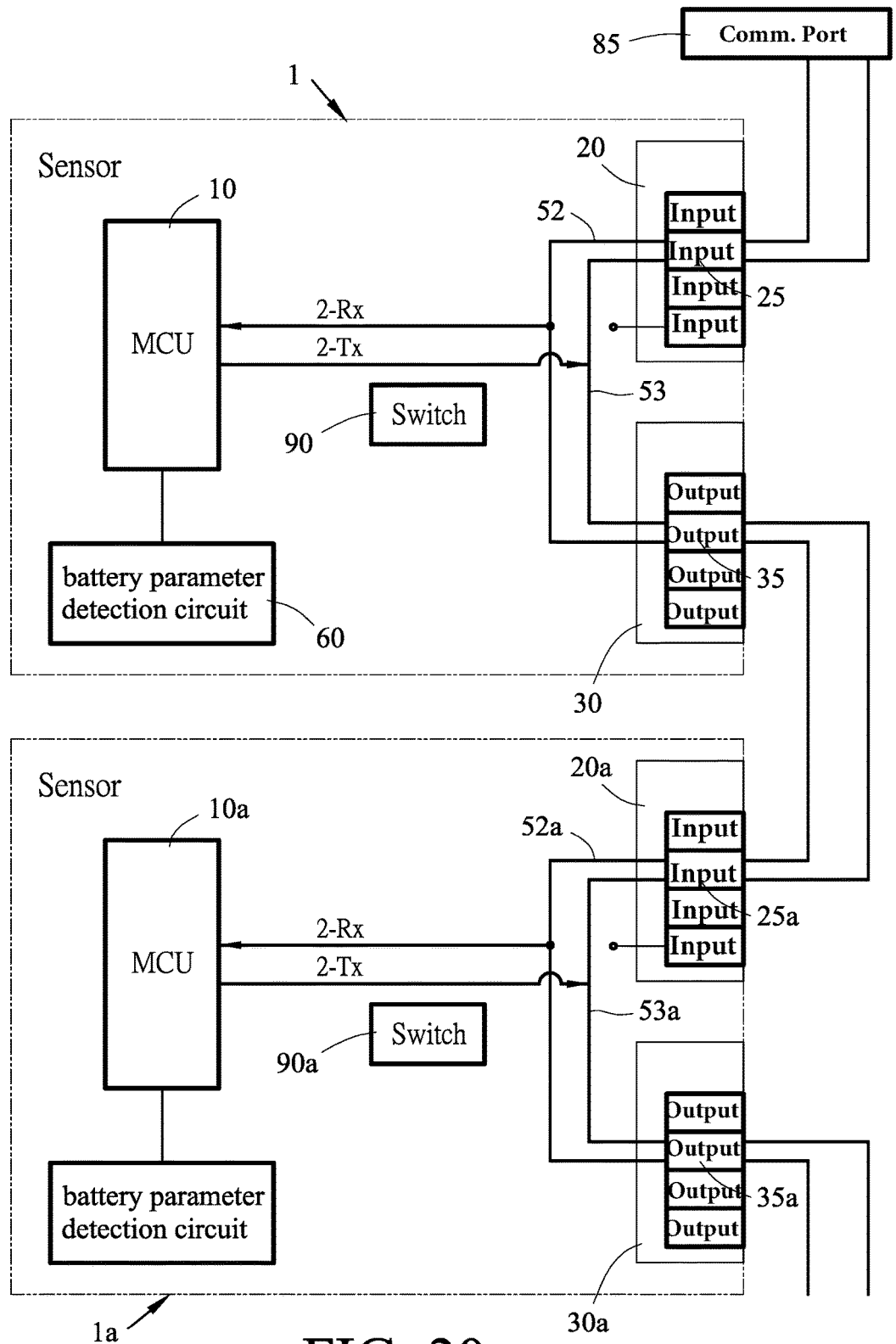
FIGS. 20 to 21 are the path diagram of parallel connection communication illustrating the third embodiment of the invention.
Figure 21:
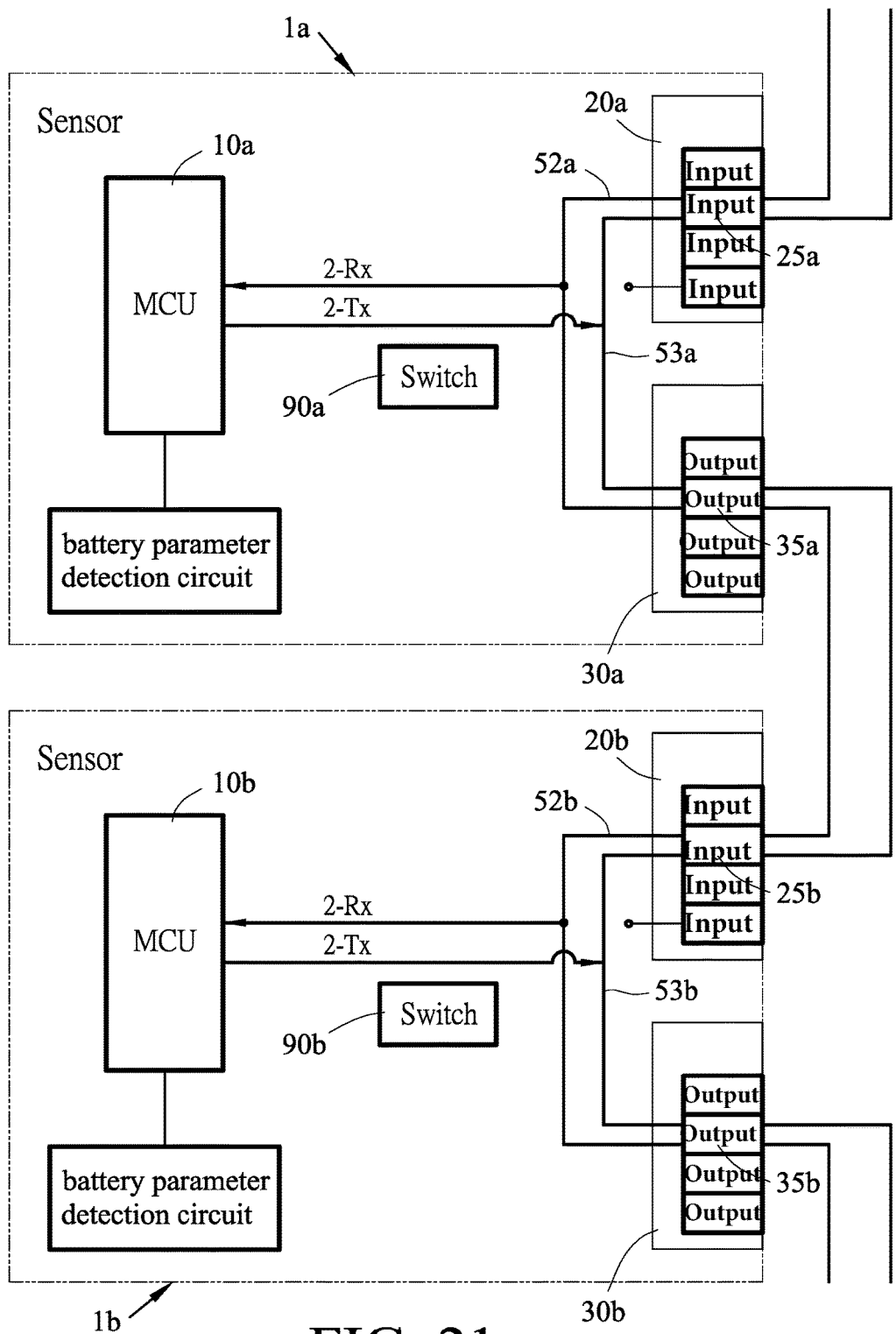

Referring to FIGS. 20 to 21, examples of a parallel connection communication path in accordance with the third embodiment, when the battery sensor 1 is operated in the battery parameter detection mode, a sequence of signal input path of the battery sensor 1 is, the communication port 85, the first communication interface 25 together with the second communication interface 35, the 2-Rx input line 52 and the processor 10; a sequence of signal output path of the battery sensor 1 is, the processor 10, the 2-Tx output line 53, the first communication interface 25 together with the second communication interface 35 and the communication port 85. A sequence of signal input path of the second battery sensor 1a is, the communication port 85, the first communication interface 25a together with the second communication interface 35a, the 2-Rx input line 52a and the processor 10a; a sequence of signal output path of the second battery sensor 1a is, the processor 10a, the 2-Tx output line 53a, the first communication interface 25a together with the second communication interface 35a and the communication port 85. A sequence of signal input path of the third battery sensor 1b is, the communication port 85, the first communication interface 25b together with the second communication interface 35b, the 2-Rx input line 52b and the processor 10b; a sequence of signal output path of the third battery sensor 1b is, the processor 10b, the 2-Tx output line 53b, the first communication interface 25b together with the second communication interface 35b and the communication port 85.

Examples of an executing manner of the site controller 80, when the site controller 80 detected that any battery sensor has not been addressed or any address is in conflict, the site controller 80 can be switched to an auto addressing mode; in the period of the auto addressing mode, the site controller 80 will transmit an addressing command; if the battery sensor 1 is first battery sensor which received the addressing command, then the battery sensor 1 will be addressed to Address#1 by its addressing mode; if the second battery sensor 1a is second battery sensor which received the addressing command, then the second battery sensor 1a will be addressed to Address#2; if the third battery sensor 1b is third battery sensor which received the addressing command, then the third battery sensor 1b will be addressed to Address#3.

What is claimed is:

1. A battery sensor with addressing mode and detection mode capability, the battery sensor comprising:
   a processor connected to at least one battery parameter detection circuit;
   an input interface having a series connection input interface and a first communication interface;
   an output interface having a series connection output interface and a second communication interface;
   an addressing channel used in a series connection manner to connect with the series connection input interface, the processor and the series connection output interface;
   a detection channel, the first communication interface and the second communication interface capable of being parallel connected to the processor by the detection channel;
   wherein the battery sensor can execute a battery addressing mode by the addressing channel, and the battery sensor can execute a battery parameter detection mode by the detection channel;
   wherein the battery sensor can connect a site controller, the battery sensor is connected to at least one second battery sensor and a third battery sensor; an output interface of the site controller is connected to the input interface of the battery sensor, the output interface of the battery sensor is connected to an input interface of the second battery sensor, an output interface of the second battery sensor is connected to an input interface of the third battery sensor, an output interface of the third battery sensor is connected to an input interface of the site controller; when the site controller detects that any battery sensor has not been addressed or any address is in conflict, the site controller can be switched to an auto addressing mode; in the period of the auto addressing mode, the site controller will transmit an addressing command, therefore the battery sensor, the second battery sensor and the third battery sensor can execute respective addressing in accordance with a received sequence of the addressing command.

2. The battery sensor with addressing mode and detection mode capability of claim 1, wherein the addressing channel has a first receiving data (1-Rx) input line and a first transmitting data (1-Tx) output line; the 1-Rx input line is used to connect the series connection input interface and the processor; the 1-Tx output line is used to connect the processor and the series connection output interface; the detection channel has a second receiving data (2-Rx) input line and a second transmitting data (2-Tx) output line; the first communication interface and the second communication interface can be parallel connected to a pin (P1) of the processor by the 2-Rx input line; the first communication interface and the second communication interface can be parallel connected to another pin (P2) of the processor by the 2-Tx output line.

3. The battery sensor with addressing mode and detection mode capability of claim 2, wherein the battery sensor further has a first transceiver (T1), and the first transceiver (T1) is connected to the 2-Rx input line and the 2-Tx output line.

4. The battery sensor with addressing mode and detection mode capability of claim 2, wherein the battery sensor further has a second transceiver (T2) and a third transceiver (T3), the second transceiver (T2) is connected to the 1-Rx input line, and the third transceiver (T3) is connected to the 1-Tx output line.

5. The battery sensor with addressing mode and detection mode capability of claim 1, wherein the addressing channel has a 1-Rx input line and a 1-Tx output line; the 1-Rx input line is used to connect the series connection input interface and the processor; the 1-Tx output line is used to connect the processor and the series connection output interface; the detection channel has a serial clock (SCL) line and a serial data (SDA) line; the first communication interface and the second communication interface can be parallel connected to a pin (P1) of the processor by the SCL line; the first communication interface and the second communication interface can be parallel connected to another pin (P2) of the processor by the SDA line.

6. The battery sensor with addressing mode and detection mode capability of claim 1, wherein the addressing channel has a first serial clock (1-SCL) line, a first serial data (1-SDA) line, a second serial clock (2-SCL) line and a second serial data (2-SDA) line (56a); the 1-SCL line and the 1-SDA line are used to connect the series connection input interface and the processor; the 2-SCL line and the 2-SDA line are used to connect the processor and the series connection output interface; the detection channel has a third serial clock (3-SCL) line and a third serial data (3-SDA) line; the first communication interface and the second communication interface can be parallel connected to a pin (P1) of the processor by the 3-SCL line; the first communication interface and the second communication interface can be parallel connected to another pin (P2) of the processor by the 3-SDA line.

7. The battery sensor with addressing mode and detection mode capability of claim 1, wherein the addressing channel has a first serial clock (1-SCL) line, a first serial data (1-SDA) line, a second serial clock (2-SCL) line and a second serial data (2-SDA) line; the 1-SCL line and the 1-SDA line are used to connect the series connection input interface and the processor; the 2-SCL line and the 2-SDA line are used to connect the processor and the series connection output interface; the detection channel has a receiving data (Rx) input line and a transmitting data (Tx) output line; the first communication interface and the second communication interface can be parallel connected to a pin (P1) of the processor by the Rx input line; the first communication interface and the second communication interface can be parallel connected to another pin (P2) of the processor by the Tx output line.

8. The battery sensor with addressing mode and detection mode capability of claim 7, wherein the battery sensor further has a first transceiver (T1), and the first transceiver (T1) is connected to the Rx input line and the Tx output line.

9. The battery sensor with addressing mode and detection mode capability of claim 1, wherein the battery sensor can connect a battery, the processor can detect parameters of the battery by the battery parameter detection circuit; the battery parameter detection circuit can be selected from a battery voltage detection circuit, a battery internal resistance detection circuit and a battery temperature detection circuit.

10. A battery sensor with addressing mode and detection mode capability, the battery sensor comprising:
a processor connected to at least one battery parameter detection circuit;
a switch connected to the processor;
an input interface having a series connection input interface and a first communication interface;
an output interface having a series connection output interface and a second communication interface;
an addressing channel used in a series connection manner to connect with the series connection input interface, the switch and the series connection output interface;
a detection channel, the first communication interface and the second communication interface can be parallel connected to the switch by the detection channel;
wherein the battery sensor can execute a battery addressing mode by the addressing channel, the battery sensor can execute a battery parameter detection mode by the detection channel, and the processor can switch between the battery addressing mode and the battery parameter detection mode by the switch;
wherein the addressing channel has a first receiving data (1-Rx) input line and a first transmitting data (1-Tx) output line; the series connection input interface is connected to a pin (S1) of the switch by the 1-Rx input line; the series connection output interface is connected to a pin (S4) of the switch by the 1-Tx output line; the detection channel has a second receiving data (2-Rx) input line and a second transmitting data (2-Tx) output line; the first communication interface and the second communication interface can be parallel connected to a pin (S2) of the switch by the 2-Rx input line; the first communication interface and the second communication interface can be parallel connected to a pin (S3) of the switch by the 2-Tx output line; a third receiving data (3-Rx) input line, a third transmitting data (3-Tx) output line and a control (Ctrl) line are provided between the switch and the processor; the processor is connected to a pin (S5) of the switch by the 3-Rx input line, the processor is connected to a pin (S6) of the switch by the 3-Tx output line, and the processor can control the switch by the Ctrl line, and therefore can switch between the battery addressing mode and the battery parameter detection mode.

11. The battery sensor with addressing mode and detection mode capability of claim 10, wherein the battery sensor further has a first transceiver (T1), and the first transceiver (T1) is connected to the 2-Rx input line and the 2-Tx output line.

12. The battery sensor with addressing mode and detection mode capability of claim 10, wherein the battery sensor further has a second transceiver (T2) and a third transceiver (T3);
the second transceiver (T2) is connected to the 1-Rx input line, and the third transceiver (T3) is connected to the 1-Tx output line.

13. A battery sensor with addressing mode and detection mode capability, the battery sensor comprising:

a processor connected to at least one battery parameter detection circuit;

an input interface having a series connection input interface, a first communication interface, a first output return interface of series connection and a signal triggering pin;

an output interface having a series connection output interface, a second communication interface, a second output return interface of series connection and a sensor detecting pin;

an addressing channel having a first receiving data (1-Rx) input line and a first transmitting data (1-Tx) output line, the 1-Rx input line being used to connect the series connection input interface and the processor, and the 1-Tx output line being used to connect the processor and the series connection output interface;

a detection channel having a second receiving data (2-Rx) input line and a second transmitting data (2-Tx) output line, the first communication interface and the second communication interface can be capable of being parallel connected to a pin (P1) of the processor by the 2-Rx input line, the first communication interface and the second communication interface capable of being parallel connected to another pin (P2) of the processor by the 2-Tx output line;

a switch having a first switching line, a second switching line, a third switching line and a fourth switching line, the first switching line connected to the sensor detecting pin, the second switching line connected to the 1-Tx output line, the third switching line connected to the second output return interface of series connection, and the fourth switching line connected to the first output return interface of series connection;

wherein the battery sensor can execute a battery addressing mode by the addressing channel, and the battery sensor can execute a battery parameter detection mode by the detection channel, the switch can enable the second switching line and the fourth switching line to form a passageway, and the switch can enable the third switching line and the fourth switching line to form another passageway.

14. The battery sensor with addressing mode and detection mode capability of claim 13, wherein the battery sensor can connect a site controller, and the battery sensor is used in a series connection manner to connect with at least one second battery sensor and a third battery sensor; an communication port of the site controller is connected to the input interface of the battery sensor, the output interface of the battery sensor is connected to an input interface of the second battery sensor; an output interface of the second battery sensor is connected to an input interface of the third battery sensor; when the site controller detects that any battery sensor has not been addressed or any address is in conflict, the site controller can be switched to an auto addressing mode; in the period of the auto addressing mode, the site controller will transmit an addressing command, and the battery sensor, the second battery sensor and the third battery sensor can execute respective addressing in accordance with a received sequence of the addressing command.

15. The battery sensor with addressing mode and detection mode capability of claim 14, wherein the battery sensor is operated in the battery addressing mode, and a sequence of input path of series connection signal is: the communication port, the series connection input interface of the battery sensor, the 1-Rx input line, the processor, the 1-Tx output line, the series connection output interface of the battery sensor, a series connection input interface of the second battery sensor, a 1-Rx input line, a processor, a 1-Tx output line, a series connection output interface of the second battery sensor, a series connection input interface of the third battery sensor, a 1-Rx input line, a processor, a 1-Tx output line, and a series connection output interface of the third battery sensor.

16. The battery sensor with addressing mode and detection mode capability of claim 15, wherein a signal triggering pin of the second battery sensor can transmit a first detecting signal, the sensor detecting pin of the battery sensor can receive the first detecting signal to control the switch of the battery sensor, and the third switching line and the fourth switching line of the battery sensor can form a passageway; a signal triggering pin of the third battery sensor can transmit a second detecting signal, a sensor detecting pin of the second battery sensor can receive the second detecting signal to control a switch of the second battery sensor, and therefore a third switching line and a fourth switching line of the second battery sensor can form a passageway; if a sensor detecting pin of the third battery sensor has not received any detecting signal, a switch of the third battery sensor will enable a second switching line and a fourth switching line of the third battery sensor to form a passageway.

17. The battery sensor with addressing mode and detection mode capability of claim 15, wherein a sequence of output return path of series connection signal is: the processor of the third battery sensor, the 1-Tx output line, the second switching line, the switch, the fourth switching line, a first output return interface of series connection of the third battery sensor, a second output return interface of series connection of the second battery sensor, the third switching line, the switch, the fourth switching line, a first output return interface of series connection of the second battery sensor, the second output return interface of series connection of the battery sensor, the third switching line, the switch, the fourth switching line, the first output return interface of series connection of the battery sensor and the communication port.

18. The battery sensor with addressing mode and detection mode capability of claim 13, wherein when the battery sensor is operated in the battery parameter detection mode, a sequence of signal input path of the battery sensor is: the communication port, the first communication interface together with the second communication interface, the 2-Rx input line and the processor; a sequence of signal output path of the battery sensor is: the processor, the 2-Tx output line, the first communication interface together with the second communication interface and the communication port; a sequence of signal input path of the second battery sensor is: the communication port, the first communication interface together with the second communication interface, the 2-Rx input line and the processor; a sequence of signal output path of the second battery sensor is: the processor, the 2-Tx output line, the first communication interface together with the second communication interface and the communication port; a sequence of signal input path of the third battery sensor is: the communication port, the first communication interface together with the second communication interface, the 2-Rx input line and the processor; a sequence of signal output path of the third battery sensor is: the processor, the 2-Tx output line, the first communication interface together with the second communication interface and the communication port.

* * * * *